United States Patent
Kudo et al.

(10) Patent No.: US 8,067,791 B2
(45) Date of Patent: Nov. 29, 2011

(54) SEMICONDUCTOR DEVICE AND METHOD FOR FABRICATING THE SAME

(75) Inventors: Hiroshi Kudo, Kawasaki (JP); Junko Naganuma, Kawasaki (JP); Sadahiro Kishii, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/621,106

(22) Filed: Nov. 18, 2009

(65) Prior Publication Data

US 2010/0059828 A1 Mar. 11, 2010

Related U.S. Application Data

(62) Division of application No. 11/245,089, filed on Oct. 7, 2005, now Pat. No. 7,642,577, which is a division of application No. 10/754,577, filed on Jan. 12, 2004, now Pat. No. 7,064,038.

(30) Foreign Application Priority Data

Jan. 14, 2003 (JP) ................................ 2003-005395

(51) Int. Cl.
- *H01L 29/76* (2006.01)
- *H01L 29/94* (2006.01)
- *H01L 31/062* (2006.01)
- *H01L 31/113* (2006.01)
- *H01L 31/119* (2006.01)

(52) U.S. Cl. ......... 257/288; 257/412; 257/369; 257/413

(58) Field of Classification Search ................... 257/369, 257/370, 773, 402, 389, 324, 347, 295, 288, 257/151, 152, 153, 249, 314, 329, 331, 366, 257/346, 384, 387, 412

See application file for complete search history.

(56) References Cited

U.S. PATENT DOCUMENTS

| | | | |
|---|---|---|---|
| 6,083,836 | A | 7/2000 | Rodder |
| 6,171,910 | B1 | 1/2001 | Hobbs et al. |
| 6,278,164 | B1 | 8/2001 | Hieda et al. |
| 6,410,376 | B1 | 6/2002 | Ng et al. |

(Continued)

FOREIGN PATENT DOCUMENTS

JP 10-125677 A 5/1998

(Continued)

OTHER PUBLICATIONS

Murarka S. P., "Silicides for VLSI Applications", Academic Press, Inc., pp. 88-95, 1983, (see pp. 3 and 44 in the spec.).

(Continued)

*Primary Examiner* — Chuong A. Luu
(74) *Attorney, Agent, or Firm* — Westerman, Hattori, Daniels & Adrian, LLP

(57) ABSTRACT

A semiconductor device formed by the steps of: forming a dummy electrode 22n and a dummy electrode 22p; forming a metal film 32 on the dummy electrode 22p; conducting a thermal treatment at a first temperature to substitute the dummy electrode 22n with an electrode 34a of a material containing the constituent material of the metal film 32; forming a metal film 36 on the dummy electrode 22n; and conducting a thermal treatment at a second temperature, which is lower than the first temperature and at which an interdiffusion of constituent materials between the electrode 34a and the metal film 36 does not take place, to substitute the second dummy electrode with an electrode 34b of a material containing the constituent material of the metal film 36.

3 Claims, 27 Drawing Sheets

U.S. PATENT DOCUMENTS

| | | |
|---|---|---|
| 6,492,260 B1 | 12/2002 | Kim et al. |
| 6,583,012 B1 | 6/2003 | Buynoski et al. |
| 6,613,621 B2 | 9/2003 | Uh et al. |
| 6,645,818 B1 | 11/2003 | Sing et al. |
| 6,693,315 B2 | 2/2004 | Kuroda et al. |
| 6,908,801 B2 | 6/2005 | Saito |
| 2004/0065930 A1* | 4/2004 | Lin et al. ........................ 257/412 |
| 2004/0094804 A1* | 5/2004 | Amos et al. .................... 257/369 |
| 2005/0136605 A1* | 6/2005 | Murto et al. ................... 438/303 |

FOREIGN PATENT DOCUMENTS

| | | |
|---|---|---|
| JP | 11-97535 A | 9/1999 |
| JP | 11-251595 A | 9/1999 |
| JP | 11-261063 A | 9/1999 |
| JP | 2001-024187 A | 1/2001 |
| JP | 2001-274379 A | 10/2001 |

OTHER PUBLICATIONS

Qin M. et al., "Investigation of Polycrystalline Nickel Silicide films as a Gate Material", Journal of the Electrochemical Society, 148 (5) (The Electrochemical Society, Inc.), pp. G271-F274 (2001) (see pp. 3 and 49 in spec.).

Japanese Office Action mailed Jun. 23, 2008, issued in corresponding Japanese Application No. 2003-00539.

Prior Art Information List associated with Item 3.

* cited by examiner

SEMICONDUCTOR DEVICE AND METHOD FOR FABRICATING THE SAME

CROSS-REFERENCE TO RELATED APPLICATIONS

This application is a divisional application of Ser. No. 11/245,089, filed on Oct. 7, 2005 now U.S. Pat. No. 7,642,577, which is a divisional application of Ser. No. 10/754,577, filed on Jan. 12, 2004 and issued as U.S. Pat. No. 7,064,038, which is based on and claims the benefit of priority from Japanese Patent Application No. 2003-005395, filed on Jan. 14, 2003, the entire contents of which are incorporated herein by reference.

BACKGROUND OF THE INVENTION

The present invention relates to a semiconductor device and a method for fabricating the same, more specifically a semiconductor device including interconnections formed of a material substituted with a metal or a metal silicide and a method for fabricating the semiconductor device.

Conventionally, as a gate electrode material of MOSFETs, the layer structure (polycide structure) of a polycrystalline silicon film and a silicide (metal silicide) film of tungsten (W) or cobalt (Co) has been widely used. The polycide structure has the merits that good MOS characteristics can be provided by the lower polycrystalline silicon film, and that the upper metal silicide film can lower the gate resistance. The polycide is a refractory material, which can stand the activation thermal processing for forming source/drain diffused layers, and permits the source/drain diffused layers to be formed by self-alignment with the gate electrodes.

The higher integration of the recent integrated circuits is conspicuous, and with this higher integration, the sizes of the gate electrodes are more diminished. The gate electrodes of the polycide structure have found it difficult to meet the requirement of higher speed. The gate electrodes are required to be formed of materials of lower resistance.

In such background, Reference 1 (Japanese published unexamined patent application No. Hei 11-251595/1999), Reference 2 (Japanese published unexamined patent application No. Hei 11-261063/1999), Reference 3 (Japanese published unexamined patent application No. 2001-024187) and Reference 4 (Japanese published unexamined patent application No. 2001-274379), for example, describe techniques which can form a source/drain diffused layer by self-alignment with the gate electrode and form the gate electrode of a metal material. References 1 to 4 disclose the technique of forming a source/drain diffused layer by self-alignment with a dummy gate electrode of polycrystalline silicon, and then substituting the polycrystalline silicon forming the dummy gate electrode with aluminum by thermal processing to thereby form the gate electrode formed of aluminum, and the technique of forming a source/drain diffused layer by self-alignment with a dummy gate electrode and then removing the dummy gate electrode to bury a metal material in the region where the dummy gate electrode has been formed, to thereby form the gate electrode of the metal.

Metal materials, such as aluminum, tungsten, molybdenum, titanium, tantalum, etc. have specific resistances of about $1/10 \sim 1/100$ of the specific resistances of the metal silicides and are useful as gate electrode materials of MOSFETs of below 0.1 μm. The use of single-layers of the metal silicides in place of the polycide structure is also effective to decrease the resistance value of the gate electrode. When the gate electrode is formed of the metal or the metal silicide, the depletion of the gate electrode, which is found in gate electrodes formed of polycrystalline silicon, does not occur. Accordingly, the gate capacitance can be small, i.e., the signal delay time can be short, and this is also a merit.

Reference 1 also proposes a technique that in an n-channel MOSFET and a p-channel MOSFET, the gate electrodes are formed of metals which agree with operational characteristics (work functions) of the respective MOSFETs.

Reference 5 (Japanese published unexamined patent application No. 2001-274379), Reference 6 (S. P. Murarka, "Silicides for VLSI Applications", Academic Press, Inc., pp. 88~95), and Reference 7 (Ming Quin et al., Journal of The Electrochemical Society, 148 (5) pp. G271~G274 (2001)) also disclose the related arts.

SUMMARY OF THE INVENTION

According to one aspect of the present invention, there is provided a method for fabricating a semiconductor device comprising the steps of: forming over a semiconductor substrate a first dummy electrode and a second dummy electrode, the first dummy electrode and the second dummy electrode being formed of a material-to-be-substituted which is substitutable with a material containing a metal; forming a first metal film of a first metal material on the first dummy electrode; conducting a thermal treatment at a first temperature to substitute the first dummy electrode with a first electrode of the first metal material or a compound of the first metal material; forming a second metal film of a second metal material on the second dummy electrode; and conducting a thermal treatment at a second temperature, which is lower than the first temperature and at which an interdiffusion of constituent materials between the first electrode and the second metal film does not take place, to substitute the second dummy electrode with a second electrode of the second metal material or a compound of the second metal material.

According to another aspect of the present invention, there is provided a method for fabricating a semiconductor device comprising the steps of: forming over a semiconductor substrate a first dummy electrode and a second dummy electrode, the first dummy electrode and the second dummy electrode being formed of a material-to-be-substituted which is substitutable with a material containing a metal; forming a protection film on the second dummy electrode; forming a first metal film of a first metal material on the first dummy electrode and the protection film; conducting a thermal treatment at a first temperature to substitute the first dummy electrode with a first electrode of the first metal material or a compound of the first metal material; removing the protection film; forming a second metal film of a second metal material on the second dummy electrode; and conducting a thermal treatment at a second temperature, which is lower than the first temperature and at which an interdiffusion of constituent materials between the first electrode and the second metal film does not take place, to substitute the second dummy electrode with a second electrode of the second metal material or a compound of the second metal material.

According to further another aspect of the present invention, there is provided a method for fabricating a semiconductor device comprising the steps of: forming over a semiconductor substrate a first dummy electrode and a second dummy electrode, the first dummy electrode and the second dummy electrode being formed of a material-to-be-substituted which is substitutable with a material containing a metal; removing the first dummy electrode; forming a conducting film of a first metal material or a compound of the first metal material in a region where the first dummy electrode has been removed to form a first electrode of the conducting film; forming on the second dummy electrode a second metal film of a second metal material which causes not an interdiffusion of constituent materials with respect to the first electrode; and conducting a thermal treatment to substitute the second dummy electrode with a second electrode of the second metal material or a compound of the second metal material.

According to further another aspect of the present invention, there is provided a method for fabricating a semiconductor device comprising the steps of: forming over a semiconductor substrate a first dummy electrode and a second dummy electrode, the first dummy electrode and the second dummy electrode being formed of a material-to-be-substituted which is substitutable with a material containing a metal; forming a first metal film of a first metal material in a region where the first dummy electrode and the second electrode are formed; forming a second metal film of a second metal material in a region where the second dummy electrode is formed; and conducting a thermal treatment to substitute the first dummy electrode with a first electrode of the first metal material or a compound of the first metal material and substitute the second dummy electrode with a second electrode of an alloy of the first metal material and the second metal material or an compound of the alloy.

According to further another aspect of the present invention, there is provided a method for fabricating a semiconductor device comprising the steps of: forming over a semiconductor substrate a first dummy electrode formed of silicon and containing a first impurity and a second dummy electrode formed of silicon and containing a second impurity different from the first impurity; forming a metal film on the first dummy electrode and the second dummy electrode; reacting the first dummy electrode and the second dummy electrode with the metal film to substitute the first dummy electrode with a first electrode of a metal silicide with the first impurity doped in and substitute the second dummy electrode with a second electrode of a metal silicide with the second impurity doped in.

According to further another aspect of the present invention, there is provided a semiconductor device comprising: a first transistor of a first conduction type including a first gate electrode formed of aluminum; and a second transistor of a second conduction type including a second gate electrode formed of a refractory metal, a refractory metal silicide or a refractory metal nitride.

According to further another aspect of the present invention, there is provided a semiconductor device comprising: a first transistor of a first conduction type including a first gate electrode formed of a first metal silicide; and a second transistor of a second conduction type including a second gate electrode formed of a second metal silicide a reaction temperature of which is higher than that of the first metal silicide.

According to further another aspect of the present invention, there is provided a semiconductor device comprising: a first transistor of a first conduction type including a first gate electrode formed of a metal silicide containing a first impurity; and a second transistor of a second conduction type including a second gate electrode formed of the metal silicide containing a second impurity different from the first impurity.

According to the present invention, the gate electrode of the n-channel transistor and the gate electrode of the p-channel transistor are formed of metal materials or their compounds the interdiffusion between which is little, whereby even in the case that the gate electrode of the n-channel transistor and the gate electrode of the p-channel transistor are formed in one continuous pattern, changes of the work functions of the constituent materials of the gate electrodes due to the thermal processing for forming the gate electrodes and thermal processing after the formation of the gate electrodes can be prevented. Thus, operational characteristics of the CMOS transistors can be easily controlled.

DETAILED DESCRIPTION OF THE INVENTION

A typical transistor used in low consumption electric power device and high-speed logic device is a complementary metal oxide semiconductor (CMOS) circuit including an n-channel MOSFET and a p-channel MOSFET connected to each other. In the CMOS circuit, for the efficient high integration, one gate electrode is commonly used for the gate electrodes of both MOSFETs. In logic circuits requiring high integration represented by SRAMs the n-channel MOSFET and the p-channel MOSFET are adjacent to each other at a very short distance. For example, in a CMOS circuit of a 0.1 µm design rule, an n-channel MOSFET and a p-channel MOSFET which are adjacent to each other at a distance of below 0.2 µm are connected to each other by one gate electrode of different metals.

However, in multi-level interconnection forming steps after the formation of the gate electrodes, thermal processing of above 400° C. is repeated. In the case that one gate electrode is formed of different metals connected to each other, there is a risk that the thermal processing after the formation of the gate electrode may diffuse the metal material forming the gate electrode of the n-channel MOSFET and the metal material forming the p-channel MOSFET into each other. Such interdiffusion deviates compositions of the metal materials forming the gate electrode from required work functions, which makes it difficult to control operational characteristics.

An object of the present invention is to provide a semiconductor device and a method for fabricating the same which can effectively prevent interdiffusion of constituent materials between the gate electrodes of an n-channel transistor and a p-channel transistor in the process of forming the gate electrodes and thermal processing steps thereafter.

Preferred embodiments, which can achieve the above-described object, will be explained below in detail.

A First Embodiment

The semiconductor device and the method for fabricating the same according to a first embodiment of the present invention will be explained with reference to FIGS. 1 to 6C.

Figure 1:
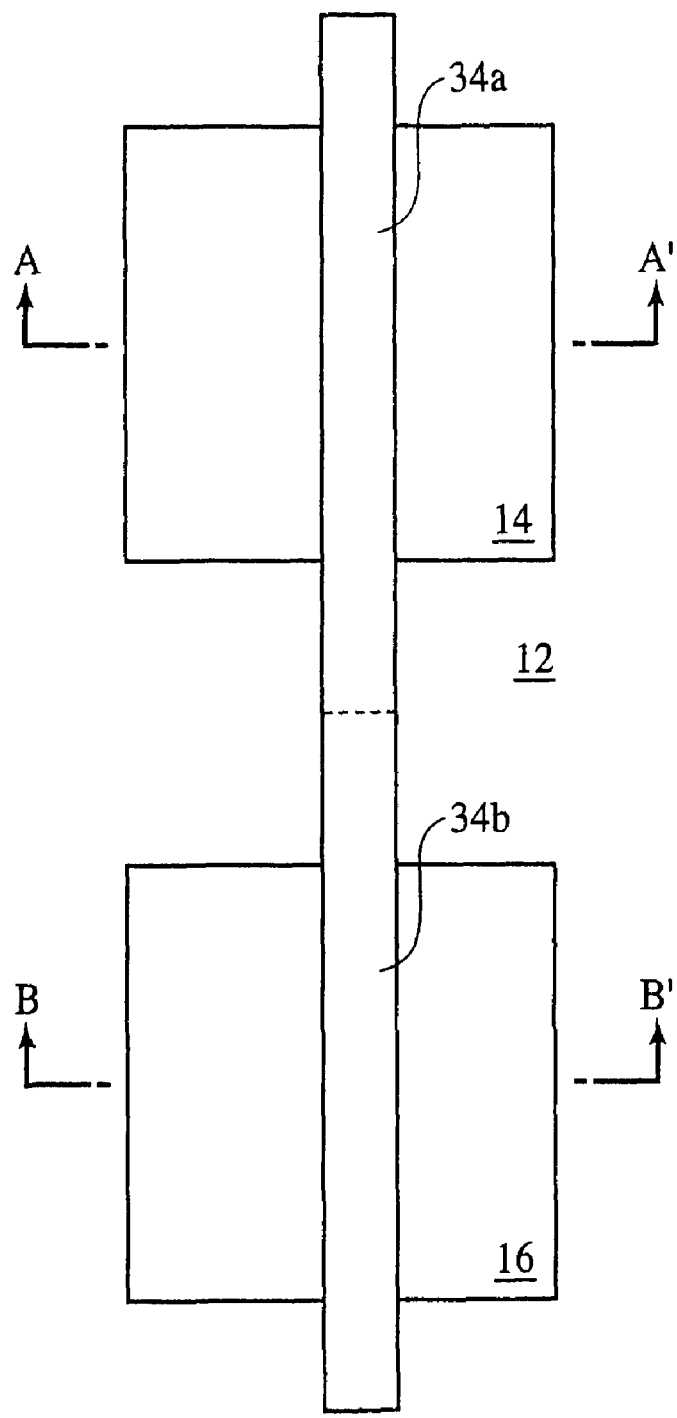
FIG. 1 is a plan view of the semiconductor device according to a first embodiment of the present invention, which shows a structure thereof.
Figure 2:
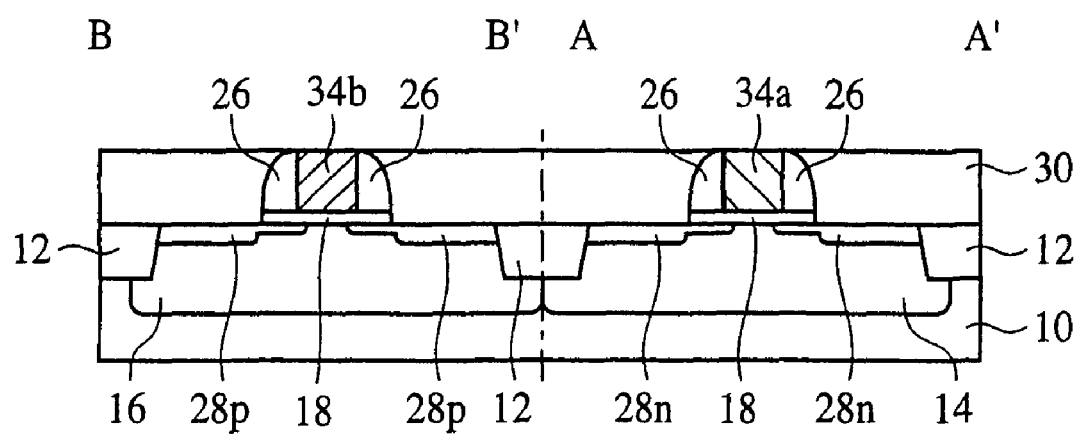
FIG. 2 is a diagrammatic sectional view of the semiconductor device according to the first embodiment of the present invention, which shows the structure thereof.

FIG. 1 is a plan view of the semiconductor device according to the present embodiment, which shows a structure thereof. FIG. 2 is a diagrammatic sectional view of the semiconductor device according to the present embodiment, which shows the structure thereof. FIGS. 3A-3C, 4A-4C, 5A-5C and 6A-6C are sectional view of the semiconductor device according to the present embodiment in the steps of the method for fabricating the same, which show the method.

First, the structure of the semiconductor device according to the present embodiment will be explained with reference to FIGS. 1 and 2. FIG. 2 is the sectional views along the line A-A' and the line B-B' in FIG. 1. In FIG. 2, for convenience, the device region on the left side of the drawing defined by a device isolation film 12 at the center is an n-channel transistor formed region (the sectional view along the line A-A'), and the device region on the right side of the drawing is a p-channel transistor formed region (the sectional view along the line B-B').

The device isolation film 12 for defining device regions is formed in a silicon substrate 10. A p-well 14 is formed in the silicon substrate 10 in the n-channel transistor formed region. A gate electrode 34a of aluminum is formed over the silicon substrate 10 in the n-channel transistor formed region with a gate insulating film 18 interposed therebetween. Source/drain diffused layers 28n are formed in the silicon substrate 10 on both sides of the gate electrode 34a. Thus, the n-channel transistor including the gate electrode 34a and the source/drain diffused layers 28n is formed in the n-channel transistor formed region.

An n-well 16 is formed in the silicon substrate 10 in the p-channel transistor formed region. A gate electrode 34b of molybdenum silicide is formed over the silicon substrate 10 in the p-channel transistor formed region with the gate insulating film 18 interposed therebetween. Source/drain diffused layers 28p are formed in the silicon substrate 10 on both sides of the gate electrode 34b. Thus, the p-channel transistor including the gate electrode 34b and the source/drain diffused layers 28p is formed in the p-channel transistor formed region.

As shown in FIG. 1, the gate electrode 34a of the n-channel transistor and the gate electrode 34b of the p-channel transistor are formed in one continuous pattern.

As described above, the semiconductor device according to the present embodiment is characterized mainly in that the gate electrode of the n-channel transistor is formed of aluminum, and the gate electrode 34b of the p-channel transistor is formed of molybdenum, and the gate electrode 34a and the gate electrode 34b are formed in one continuous pattern.

The gate electrode 34a of the n-channel transistor is formed of aluminum, whereby the gate interconnection can be made less resistive, which makes the n-channel transistor speedy. The work function of aluminum is suitable for the gate electrode of the n-channel transistor. The gate electrode 34b of the p-channel transistor is formed of molybdenum silicide, whereby the gate interconnection can be made less resistive, which makes the p-channel transistor speedy. The work function of molybdenum silicide is suitable for the gate electrode of the p-channel transistor.

The diffusion rate of aluminum atoms in molybdenum silicide is very low. The silicon atoms and molybdenum atoms in molybdenum silicide, which is a thermally stable compound, are not diffused into aluminum. Accordingly, the interdiffusion of the constituent materials between the gate electrodes 34a, 34b is very small, and even when the gate electrodes 34a, 34b are formed in one continuous pattern in forming the CMOS circuit, changes of the work functions of the gate electrodes 34a, 34b due to thermal processing in the multi-level interconnection forming step, etc. can be prevented.

Next, the method for fabricating the semiconductor device according to the present embodiment will be explained with reference to FIGS. 3A to 6C.

First, the device isolation film 12 for defining the device regions is formed in a p-type silicon substrate 10 by, e.g., STI (Shallow Trench Isolation) method. FIGS. 3A to 6C are sectional views of the semiconductor device in the steps of the method for fabricating the same, which correspond to the cross section shown in FIG. 2. The region for the n-channel transistor to be formed in is illustrated in the device region on the right side of the respective drawings, which is defined by the device isolation film 12 at the center, and the region for the p-channel transistor to be formed in is illustrated in the device region on the left side of the respective drawings.

Figure 3A:
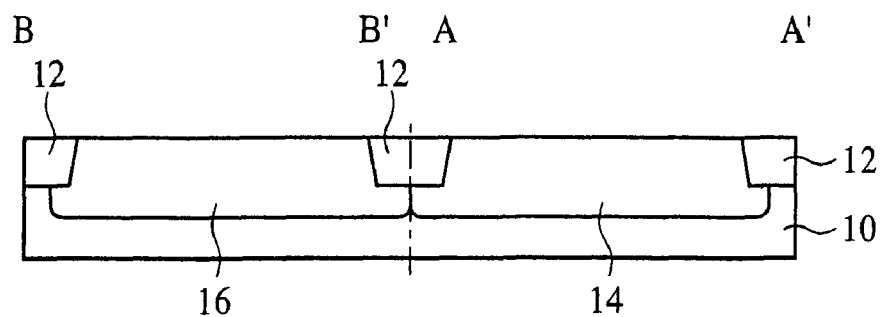
FIGS. 3A-3C, 4A-4C, 5A-5C and 6A-6C are sectional views of the semiconductor device according to the first embodiment of the present invention in the steps of the method for fabricating the same, which show the method.

Then, the p-well 14 and the n-well 16 are formed by ion implantation respectively in the region for the n-channel transistor to be formed in and the region for the p-channel transistor to be formed in (FIG. 3A). Concurrently with the forming the wells, ion implantation for controlling the threshold voltages and ion implantation for forming impurity doped regions for the punch-through stopper may be performed.

Figure 3B:
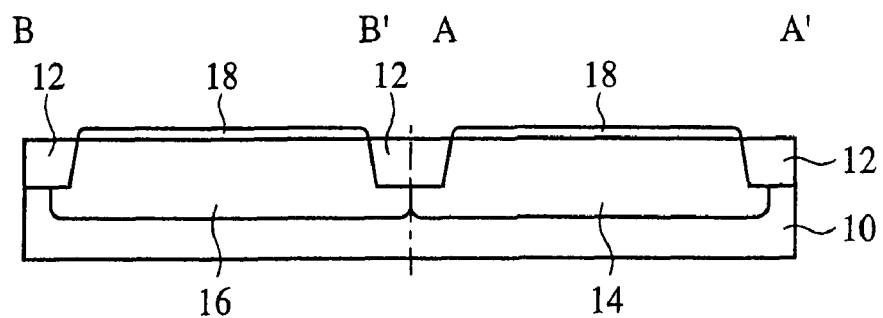

Then, the surface of the silicon substrate 10 is thermally oxidized by thermal oxidation method to form the gate insulating film 18 of, e.g., a silicon oxide film on the device regions (FIG. 3B). The gate insulating film 18 may be formed of a silicon oxynitride film, silicon nitride film, alumina film, high-dielectric constant film, such as $Ta_2O_5$, $La_2O_3$, $HfO_2$, $ZrO_2$, $ZrAl_xO_y$ silicate, $HfAl_xO_y$ aluminate or others.

Figure 3C:
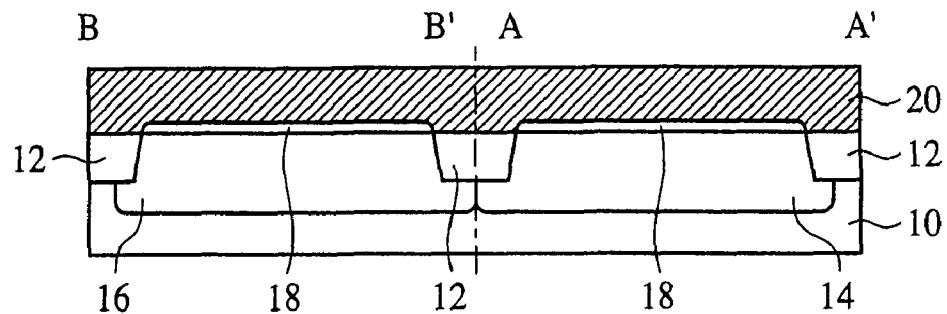

Next, a polycrystalline silicon film 20 of, e.g., a 50 nm-thick is deposited on the entire surface by, e.g., CVD method (FIG. 3C). Silicon is a material which can be substituted with a metal materials, such as aluminum or others. In place of the polycrystalline silicon film, a germanium (Ge) film, SiGe film or others, for example, which are substitutable with aluminum, may be formed.

Then, the polycrystalline silicon film 20 is patterned by photolithography and dry etching to form a dummy gate electrode 22n of the polycrystalline silicon film 20 in the region for the n-channel transistor to be formed in and a dummy gate electrode 22p of the polycrystalline silicon film 20 in the region for the p-channel transistor to be formed in. The dummy gate electrodes 22n 22p have, e.g., a 50 nm-height and a 40 nm-width (gate length).

Figure 4A:
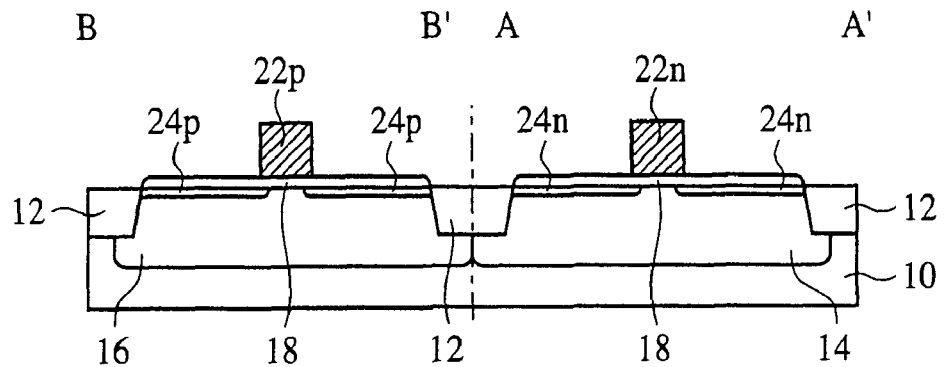

Next, with the dummy gate electrode 22n as the mask, arsenic (As) ions, for example, are implanted in the region for the n-channel transistor to be formed in to form in the silicon substrate 10 impurity diffused regions 24n to be lightly doped regions of the LDD structure or extension regions of the extension source/drain structure (FIG. 4A).

In the same way, with the dummy gate electrode 22p as the mask, boron (B) ions, for example, are implanted in the region for the p-channel transistor be formed in to form in the silicon substrate 10 impurity diffused regions 24p to be lightly doped regions of the LDD structure or extension regions of the extension source/drain structure (FIG. 4A).

Then, a silicon nitride film of, e.g., a 100 nm-thick is deposited by, e.g., CVD method and is etched back to form sidewall insulating films 26 of the silicon nitride film on the side walls of the dummy gate electrodes 22n, 22p.

Next, with the dummy gate electrode 22n and the sidewall insulating films 26 as the mask, arsenic (As) ions, for example, are implanted in the region for the n-channel transistor to be formed in to form heavily impurity doped source/drain diffused regions in the silicon substrate 10 on both sides of the dummy gate electrode 20n and the sidewall insulating films 26.

In the same way, with the dummy gate electrode 22p and the sidewall insulating films 26 as the mask, boron fluoride ($BF_2$) ions, for example, are implanted in the region for the p-channel transistor to be formed in to form heavily impurity doped source/drain regions in the substrate 10 on both sides of the dummy gate electrode 22p and the sidewall insulating films 26.

Figure 4B:
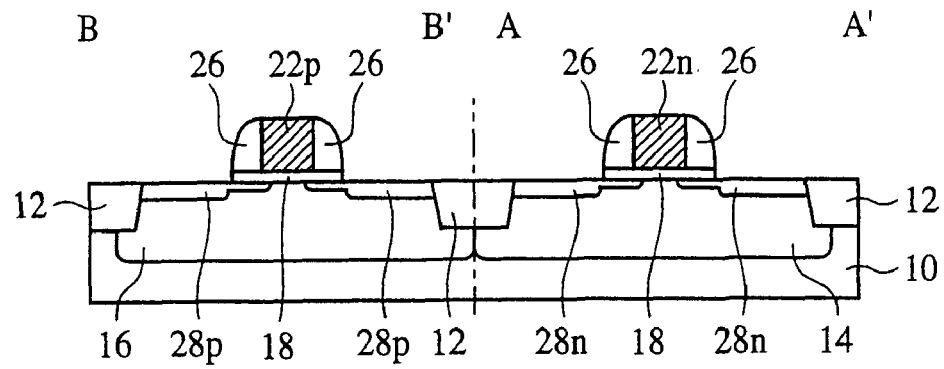

Next, the implanted impurities are activated by prescribed thermal processing to form the n-type source/drain diffused layers 28n of the LDD structure or the extension S/D structure in the silicon substrate 10 on both sides of the dummy gate electrode 22n, and the p-type source/drain diffused layers 28p of the LDD structure or the extension S/D structure in the silicon substrate 10 on both sides of the dummy gate electrode 22p (FIG. 4B).

Next, a silicon oxide film of, e.g., a 300 nm-thick is formed on the entire surface by, e.g., plasma CVD method.

Figure 4C:
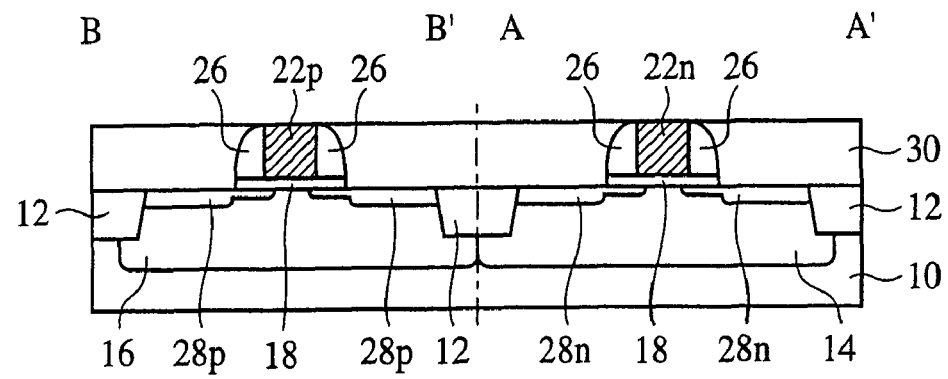

Then, the silicon oxide film is removed flat by, e.g., CMP (Chemical Mechanical Polishing) method until the surfaces of the dummy gate electrodes 22n, 22p are exposed to form an inter-layer insulating film 30 of the silicon oxide film (FIG. 4C). When occupied ratios of the dummy gate electrodes 22n, 22p per a unit area much vary, the polishing distribution is deteriorated, and heights of the dummy gates electrodes much vary. Accordingly, it is preferable that occupied ratios of the dummy gate electrodes 22n, 22p are made as equal to each other as possible to thereby lower the pattern dependency in the chip.

Next, a molybdenum (Mo) film 32 of, e.g., a 200 nm-thick is deposited on the inter-layer insulating film 30 by, e.g., sputtering method.

Figure 5A:
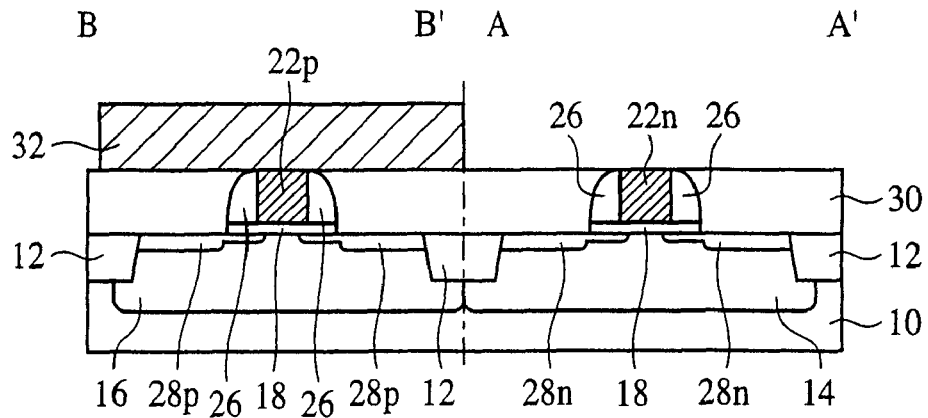

Then, the molybdenum film 32 is patterned by photolithography and dry etching to leave the molybdenum film 32 selectively on the dummy gate electrode 22p (FIG. 5A). At this time, the patterned molybdenum film 32 should not be extended over the device region of the region for the n-channel transistor to be formed in.

In place of patterning the molybdenum film 32, a protection film for covering the upper side of the dummy gate electrode 22n may be formed as will be described later in, e.g., a fifth and a sixth embodiments (silicon oxide film 38, 54).

Figure 5B:
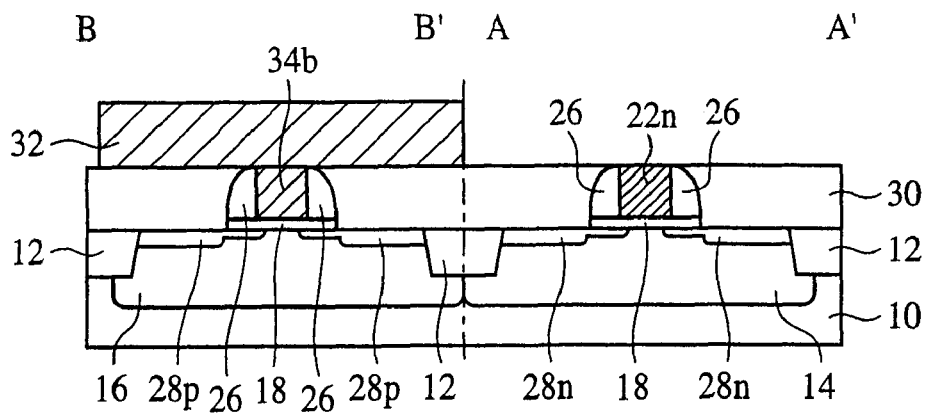

Then, thermal processing is performed in a nitrogen atmosphere for 10 minutes in a temperature range of 500~700° C., e.g., at 550° C. This thermal processing starts the silicidation reaction from the interface between the dummy gate electrode 22p and the molybdenum film 32 to substitute the dummy gate electrode 22p of polycrystalline silicon with a gate electrode 34b of molybdenum silicide ($MoSi_x$) (FIG. 5B).

Figure 5C:
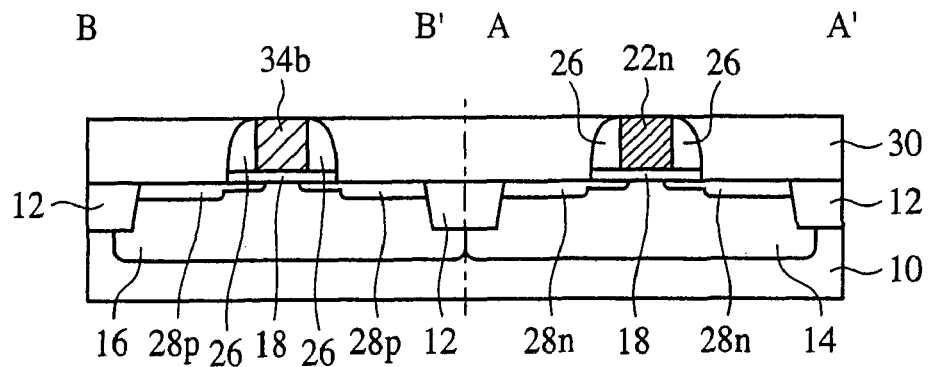

Next, the molybdenum film 32 is polished by, e.g., CMP method until the upper surface of the inter-layer insulating film 30 is exposed to remove the molybdenum film 32 on the inter-layer insulating film 30 (FIG. 5C). The molybdenum film 32 may be removed by dry etching or wet etching in place of CMP method.

Then, an aluminum film 36 of, e.g. a 400 nm-thick is formed on the inter-layer insulating film 30 by, e.g., sputtering method.

Figure 6A:
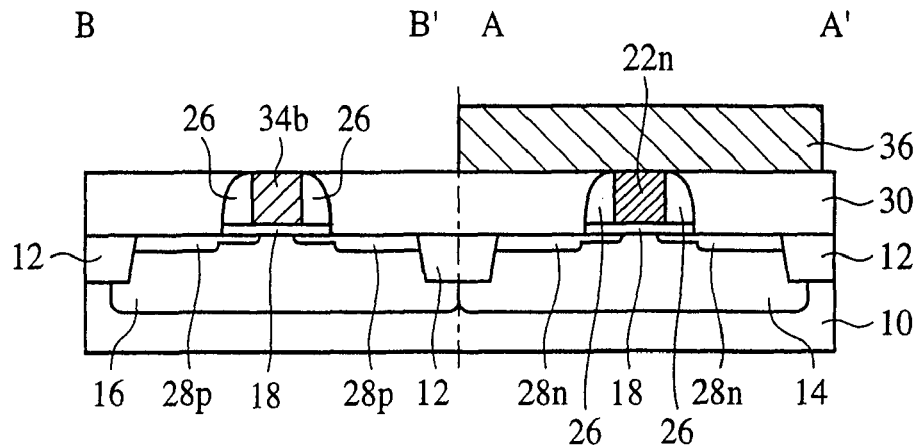
Figure 6B:
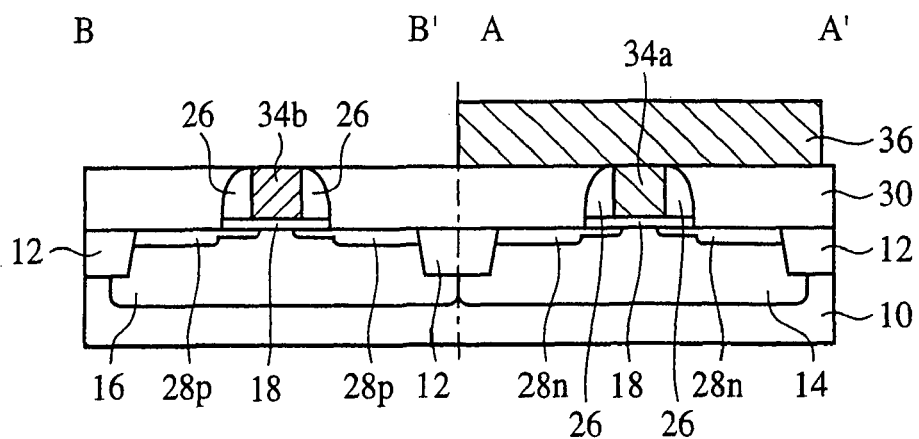

Then, the aluminum film 36 is patterned by photolithography and dry etching to leave the aluminum film 36 selectively on the dummy gate electrode 22n (FIG. 6A).

Next, thermal processing is performed in a nitrogen atmosphere for 30 minutes in a 350~500° C. temperature range, e.g., at 400° C. This thermal processing starts the reaction from the interface between the dummy gate electrode 22n and the aluminum film 36 to substitute the dummy gate electrode 22n of polycrystalline silicon with a gate electrode 34a of aluminum.

At this time, the diffusion rate of aluminum atoms in molybdenum silicide is so low that in the thermal processing for substituting the dummy gate electrode 22n with aluminum, it does not take place that the aluminum atoms are diffused into the gate electrode 34b, influencing the work function of the gate electrode 34b. Even in thermal processing which will be performed in a later step of forming the multi-level interconnection, the aluminum atoms are not diffused into the molybdenum silicide. Molybdenum silicide is a thermally stable compound, and the molybdenum atoms and the silicon atoms are not diffused into the aluminum. Thus, the n-channel transistor and the p-channel transistor have the gate electrodes 34a, 34b formed respectively of materials having required work functions, and can control the operation of the CMOS transistors with high accuracy.

Figure 6C:
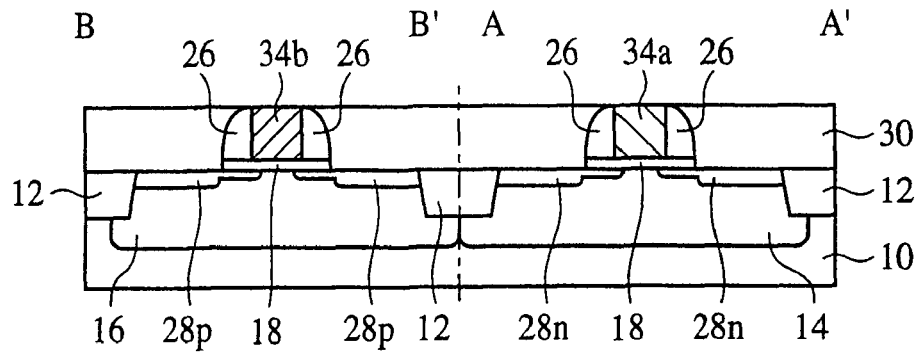

Then, the aluminum film 36 is polished by, e.g., CMP method until the upper surface of the inter-layer insulating film 30 is exposed to remove the aluminum film 36 on the inter-layer insulating film 30 (FIG. 6C). The aluminum film 36 may be removed by dry etching or wet etching in place of CMP method.

The string of processes of substituting the dummy gate electrode 22p with molybdenum silicide is performed preferably before the string of processes of substituting the dummy gate electrode 22n with aluminum. This is because performing the process whose thermal processing temperature is higher can effectively suppress the interdiffusion between both metal materials.

As described above, according to the present invention, the gate electrode of the n-channel transistor is formed of aluminum, and the gate electrode of the p-channel transistor is formed of molybdenum silicide, whereby the interdiffusion of the constituent materials between the gate electrode of the n-channel transistor and the gate electrode of the p-channel transistor can be prevented. Accordingly, even in the case that the gate electrode of the n-channel transistor and the gate electrode of the p-channel transistor are formed in one continuous pattern, changes of the work functions of the constituent materials of the gate electrodes due to the thermal processing after the formation of the gate electrodes can be prevented.

In the present embodiment, the thermal processing for the substitution with aluminum is performed after the aluminum film 36 has been patterned, but the aluminum atoms are not diffused into the molybdenum silicide at the thermal processing temperature for the substitution with aluminum. This permits the thermal processing to be performed without patterning the aluminum film 36.

A Second Embodiment

The semiconductor device and the method for fabricating the same according to a second embodiment of the present invention will be explained with reference to FIGS. 7 to 10C. The same members of the present embodiment as those of the semiconductor device and the method for fabricating the same according to the first embodiment shown in FIGS. 1 to 6C are represented by the same reference numbers not to repeat or to simplify their explanation.

Figure 7:
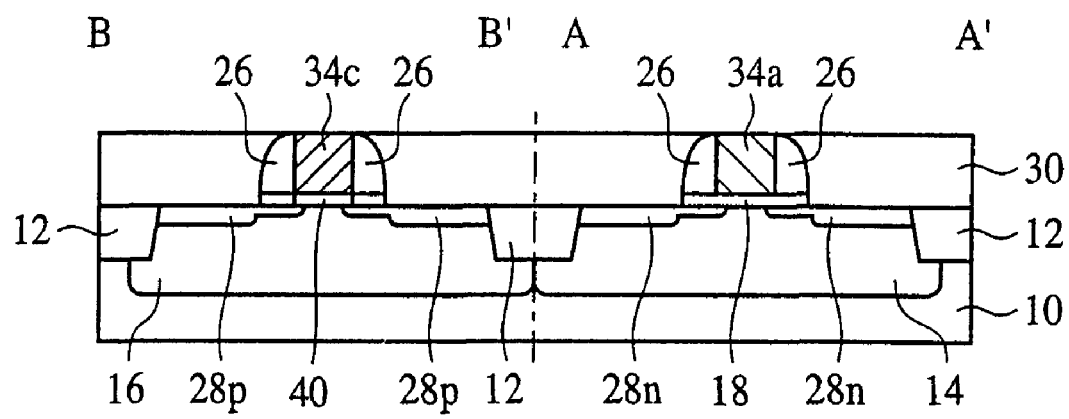
FIG. 7 is a diagrammatic sectional view of the semiconductor device according to a second embodiment of the present invention, which shows a structure thereof.

FIG. 7 is a diagrammatic sectional view of the semiconductor device according to the present embodiment, which shows a structure thereof. FIGS. 8A to 10C are sectional views of the semiconductor device according to the present embodiment in the steps of the method for fabricating the same, which show the method.

First the structure of the semiconductor device according to the present embodiment will be explained with reference to FIG. 7.

The semiconductor device according to the present embodiment is the same in the basic structure as the semiconductor device according to the first embodiment shown in FIGS. 1 and 2. The semiconductor device according to the present embodiment is characterized mainly in that the gate electrode 34c of a p-channel transistor is formed of titanium nitride (TiN). The gate electrode 34a of an n-channel transistor is formed of aluminum, as in the first embodiment.

Titanium nitride which, which is known as a barrier metal, functions as a diffusion barrier to aluminum. Accordingly, when the gate electrode 34c of the p-channel transistor is formed of titanium nitride, and the gate electrode 34a of the n-channel transistor is formed of aluminum, the interdiffusion of the constituent materials between the gate electrodes 34a, 34c is very little, whereby even when the gate electrodes 34a, 34c to form CMOS circuit are formed in one continuous pattern, changes of the work functions of the gate electrodes 34a, 34c due to thermal processing in later multi-level interconnection forming step, etc. can be prevented. The gate electrode of the p-channel transistor is formed of titanium nitride, whereby the gate interconnection can be less resistive, and the p-channel transistor can have higher speed. The work function of the titanium nitride is suitable for the gate electrode of the p-channel transistor.

Next, the method for fabricating the semiconductor device according to the present embodiment will be explained with reference to FIGS. 8A to 10C.

Figure 8A:
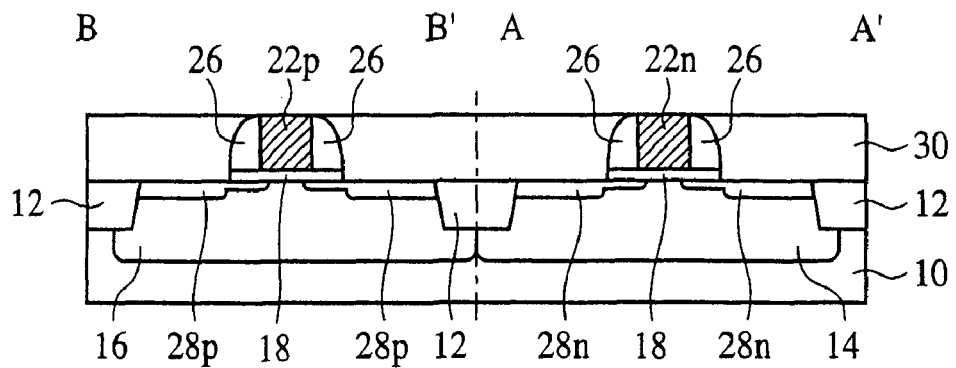
FIGS. 8A-8C, 9A-9C and 10A-10C are sectional views of the semiconductor device according to the second embodiment of the present invention in the steps of the method for fabricating the same, which show the method.

First, in the same way as in the method for fabricating the semiconductor device according to the first embodiment shown in, e.g., FIGS. 3A to 4C, dummy gate electrodes 22n, 22p, an inter-layer insulating film 30, etc. are formed (FIG. 8A).

Then, a silicon oxide film 38 of, e.g., a 200 nm-thick is formed on the entire surface by, e.g., plasma CVD method. In place of the silicon oxide film, a material which has etching selectivity with respect to polycrystalline silicon film, e.g., silicon nitride film or photoresist film may be used.

Figure 8B:
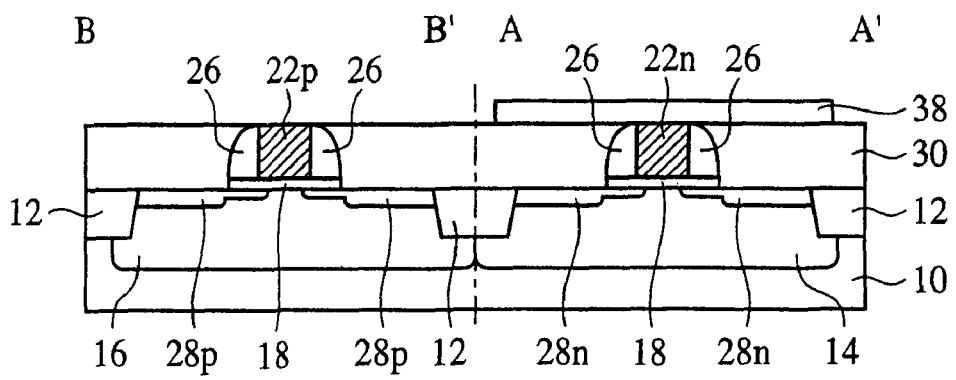

Next, the silicon oxide film 38 is patterned by photolithography and dry etching to leave the silicon oxide film 38 on the dummy gate electrode 22n (FIG. 8B). At this time, the upper surface of the dummy gate electrode 22n must be completely covered.

Figure 8C:
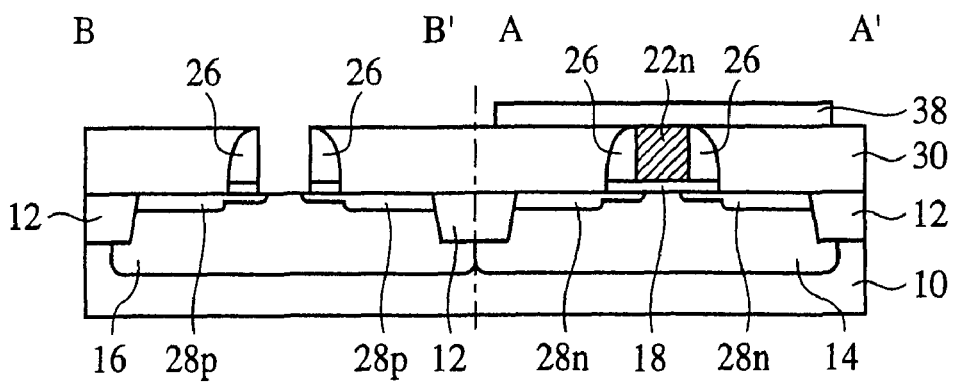

Then, with the silicon oxide film 38 as the mask, the dummy gate electrode 22p is selectively removed by dry etching. At this time, when there is a risk that the gate insulating film 18 below the dummy gate electrode 22p might be damaged, the gate insulating film 18 may be also removed (FIG. 8C). The gate insulating film 18 must not be essentially removed.

Figure 9A:
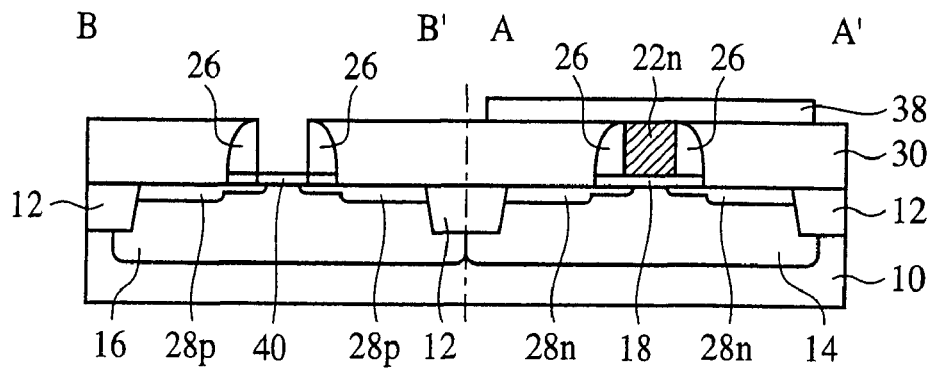

Then, a gate insulating film 40 of the silicon oxide film is formed by thermal oxidation on the silicon substrate 10 in a region exposed by the removal of the gate insulating film 18 (FIG. 9A).

Figure 9B:
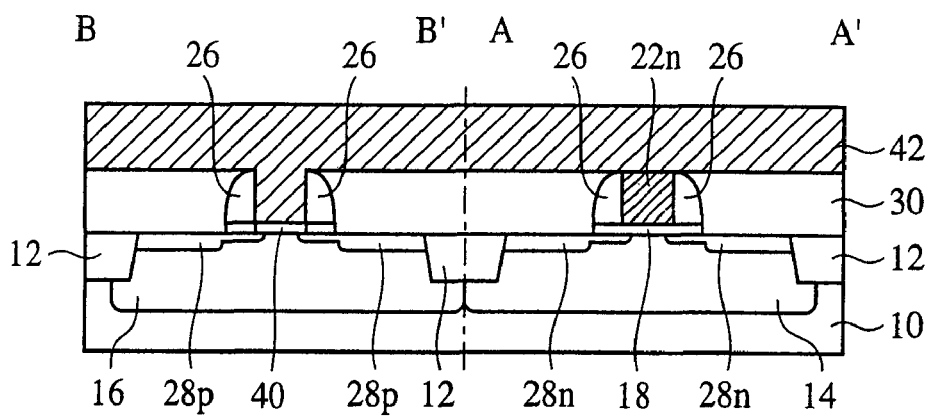

Then, after the silicon oxide film 38 has been removed, a titanium nitride film 42 of, e.g., a 200 nm-thick is formed by, e.g., thermal CVD method (FIG. 9B).

Figure 9C:
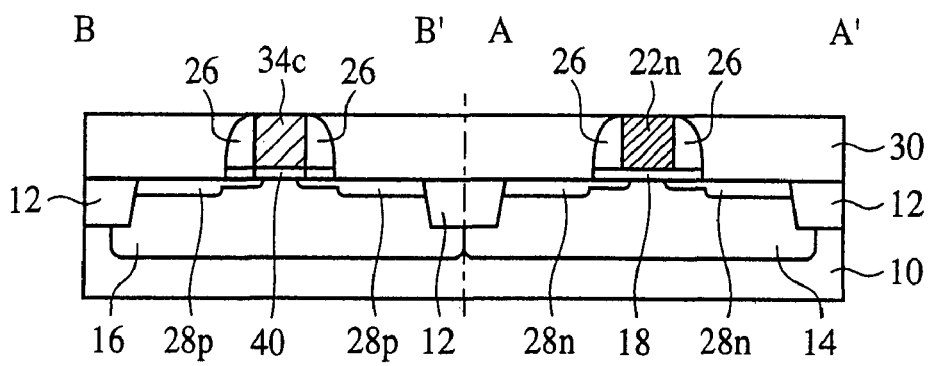

Next, the titanium nitride film 42 is polished by, e.g., CMP method until the upper surface of the inter-layer insulating film 30 is exposed to remove the titanium nitride film 42 on the inter-layer insulating film 30. Thus, a gate electrode 34c of the titanium nitride is formed on the gate insulating film 40 (FIG. 9C). The titanium nitride film 42 may be removed by dry etching or wet etching in place of CMP.

Figure 10A:
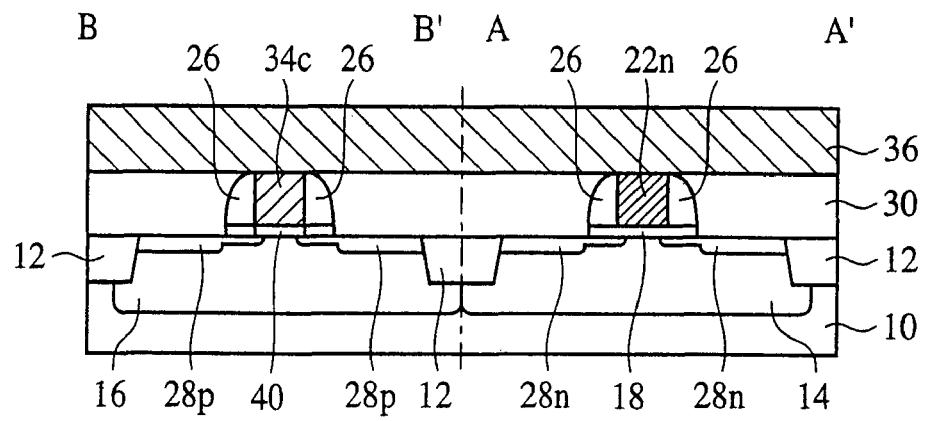

Then, an aluminum film 36 of, e.g., a 400 nm-thick is formed on the inter-layer insulating film 30 by, e.g., sputtering method (FIG. 10A). In the present embodiment, it is not necessary to pattern the aluminum film 36 in advance, because titanium nitride, of which the gate electrode 34c is formed, does not react with the aluminum in the thermal processing in later steps.

Figure 10B:
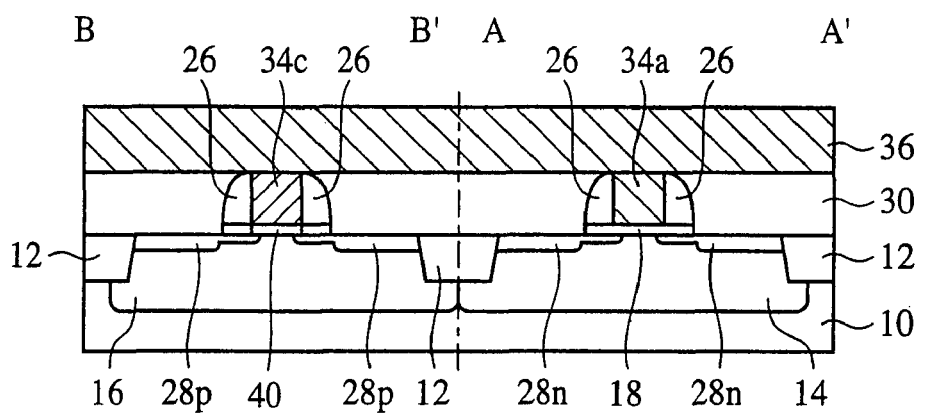

Next, thermal processing is performed for 30 minutes in a nitrogen atmosphere in a 350–500° C. temperature range, e.g., at 400° C. This thermal processing starts the reaction from the interface between the dummy gate electrode 22n and the aluminum film 36 to substitute the dummy gate electrode 22n of polycrystalline silicon with a gate electrode 34a of aluminum (FIG. 10B).

At this time, the titanium nitride film and the aluminum do not react with each other. Accordingly, the n-channel transistor and the p-channel transistor have the gate electrodes 34a, 34c formed of the materials having the respective required work functions, whereby the operation of the CMOS transistors can be controlled with high accuracy.

Figure 10C:
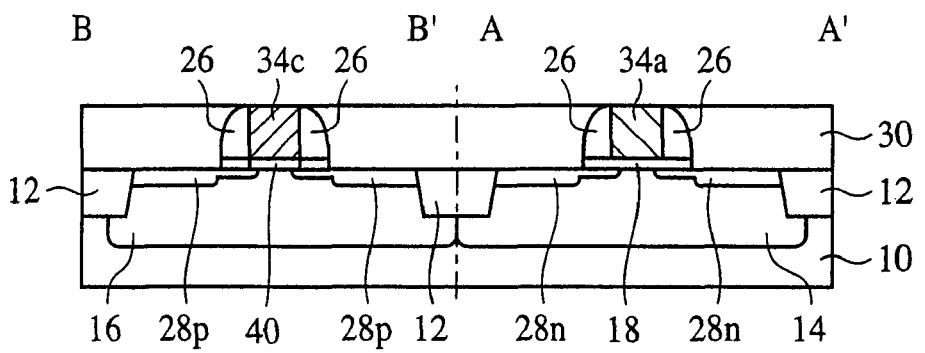

Then, the aluminum film 36 is polished by, e.g., CMP method until the upper surface of the inter-layer insulating film 30 is exposed to remove the aluminum film 36 on the inter-layer insulating film 30 (FIG. 10C). The aluminum film 36 may be removed by dry etching or wet etching in place of CMP method.

As described above, according to the present embodiment, the gate electrode of the n-channel transistor is formed of aluminum, and the gate electrode of the p-channel transistor is formed of titanium nitride, whereby the interdiffusion of the constituent materials between the gate electrode of the n-channel transistor and the gate electrode of the p-channel transistor can be prevented. Even in the case that the gate electrode of the n-channel transistor, and the gate electrode of the p-channel transistor are formed in one continuous pattern, changes of the work functions of the materials forming the gate electrodes due to the thermal processing after the gate electrodes have been formed can be prevented.

In the present embodiment, the gate electrode of the p-channel transistor is formed of titanium nitride but may be formed of a material other than titanium nitride, which functions as a barrier metal, e.g., tantalum nitride (TaN), tungsten nitride (WN), TiAlSi, TiSiN, TaSiN, WSiN or others.

A Third Embodiment

The semiconductor device according to a third embodiment of the present invention will be explained with reference to FIGS. 11 to 13B. The same members of the semiconductor device and the method for fabricating the same according to the present embodiment as those of the semiconductor device and the method for fabricating the same according to the first and the second embodiments shown in FIGS. 1 to 10C are represented by the same reference numbers not to repeat or to simplify their explanation.

Figure 11:
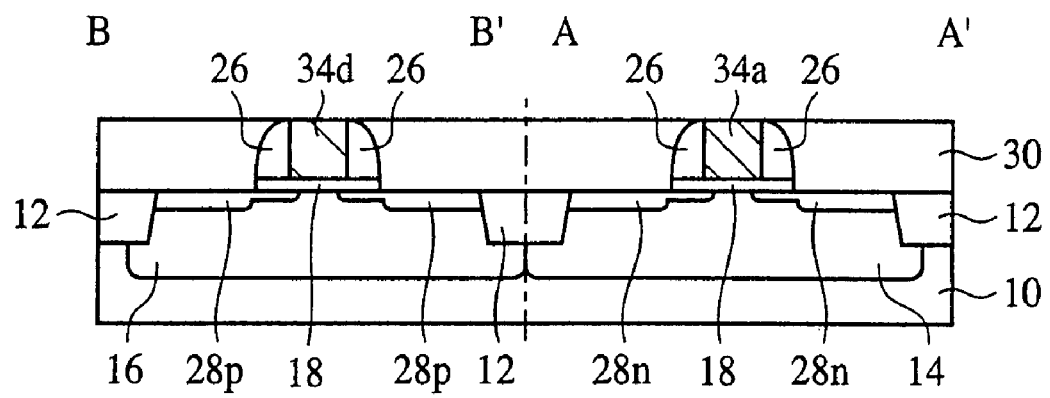
FIG. 11 is a diagrammatic sectional view of the semiconductor device according to a third embodiment of the present invention, which shows a structure thereof.

FIG. 11 is a diagrammatic sectional view of the semiconductor device according to the present embodiment, which shows a structure thereof. FIGS. 12A-12C and 13A-13B are sectional views of the semiconductor device according to the present embodiment in the steps of the method for fabricating the same, which show the method.

First, the structure of the semiconductor device according to the present embodiment will be explained with reference to FIG. 11.

The semiconductor device according to the present embodiment is the same in the basic structure as the semiconductor device according to the first embodiment shown in FIGS. 1 and 2. The semiconductor device according to the present embodiment is characterized mainly in that the gate electrode 34d of the p-channel transistor is formed of an alloy of titanium and aluminum (TiAl alloy). The gate electrode 34a of the n-channel transistor is formed of aluminum, as in the first embodiment.

TiAl alloy is a thermally stable alloy compound, and in thermal processing steps after the formation of the gate electrode, from the TiAl alloy, neither the diffusion of titanium into the aluminum nor the diffusion of the aluminum takes place. Accordingly, in the case that the gate electrode 34d of the p-channel transistor is formed of a TiAl alloy, and the gate electrode 34a of the n-channel transistor is formed of aluminum, the interdiffusion of the constituent material between the gate electrodes 34a, 34d is very little, and even in the case that the gate electrodes 34a, 34d of CMOS circuit are formed in one continuous pattern, changes of the work functions of the gate electrodes 34a, 34d due to the thermal processing in the multi-level interconnection forming step, etc. can be prevented. The gate electrode of the p-channel transistor is formed of a TiAl alloy, whereby the gate interconnection can be less resistive, and the p-channel transistor can be speedy. The work function of the TiAl alloy is suitable also for the gate electrode of the p-channel transistor.

Next, the method for fabricating the semiconductor device according to the present embodiment will be explained with reference to FIGS. 12A to 13B.

Figure 12A:
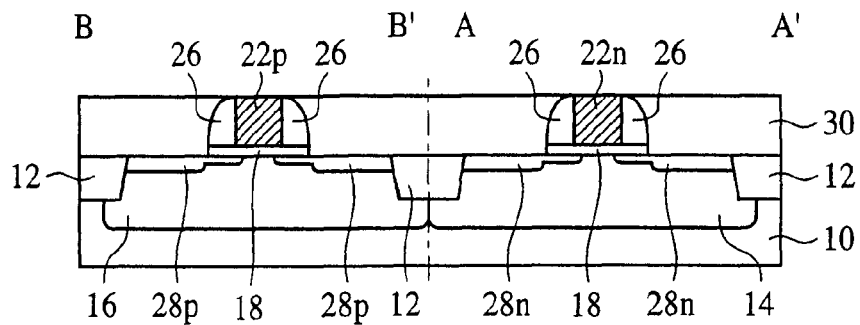
FIGS. 12A-12C and 13A-13B are sectional views of the semiconductor device according to the third embodiment of the present invention in the steps of the method for fabricating the same, which show the method.

First, in the same way as in, e.g., the method for fabricating the semiconductor device according to the first embodiment shown in FIGS. 3A to 4C, the dummy gate electrodes 22n, 22p, the inter-layer insulating film 30, etc. are formed (FIG. 12A).

Figure 12B:
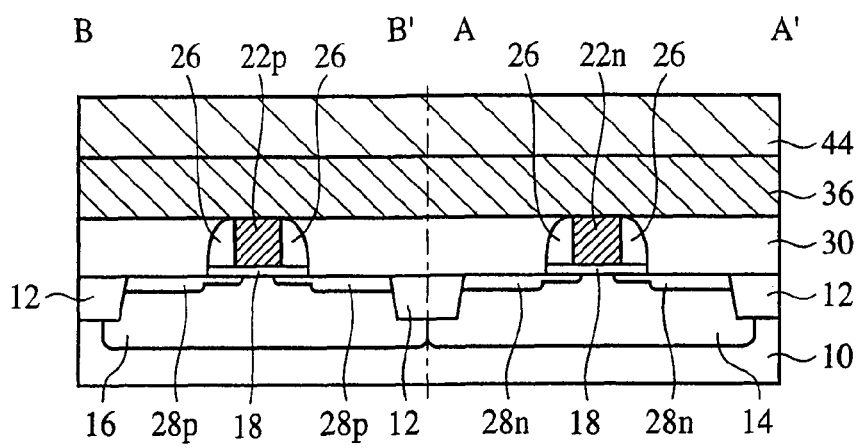

Then, an aluminum film 36 of, e.g., a 400 nm-thick and a titanium (Ti) film 44 of, e.g., a 200 nm-thick are formed on the entire surface by, e.g., sputtering method (FIG. 12B). The film thicknesses of the aluminum film 36 and the titanium film 44 are suitably set in accordance with a composition of a TiAl alloy suitable to be used as the gate electrode 34d.

Figure 12C:
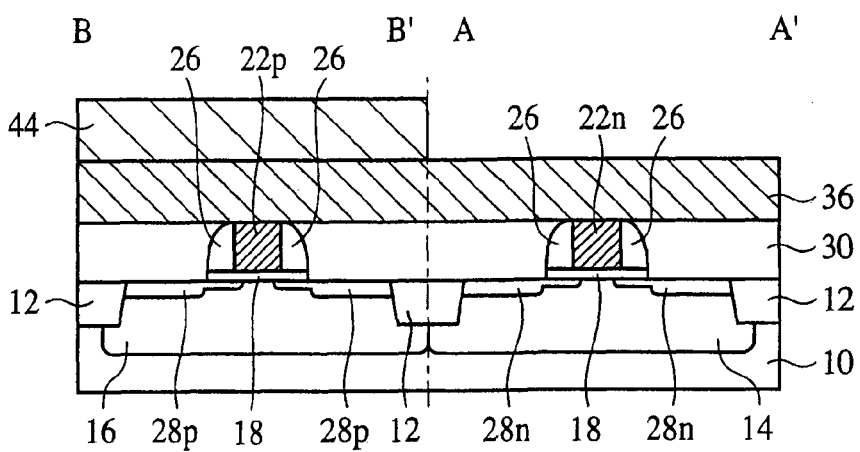

Then, the titanium film 44 is patterned by photolithography and dry etching to leave the titanium film 44 selective in the region for the p-channel transistor to be formed in (FIG. 12C).

Next, thermal processing is performed for 30 minutes in a nitrogen atmosphere in a 400~500° C. range, e.g., at 400° C.

Figure 13A:
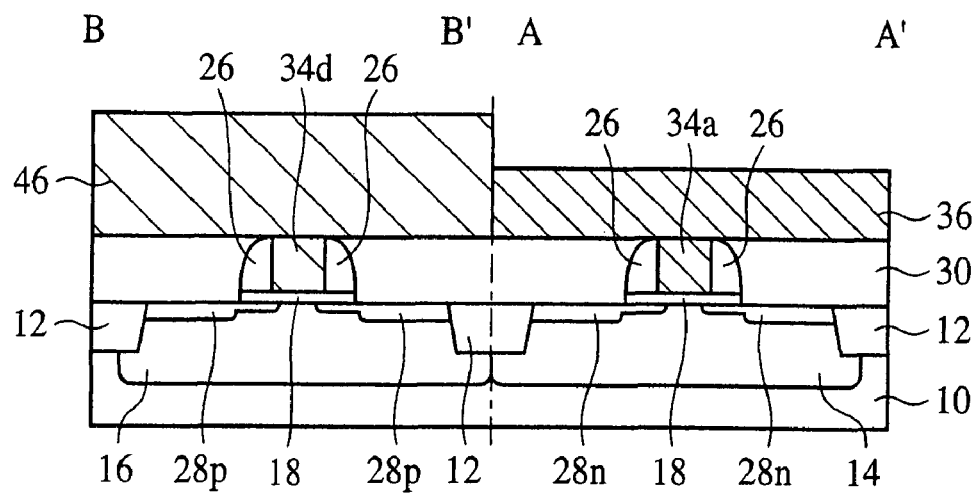

In the region for the n-channel transistor to be formed in, this thermal processing starts the reaction from the interface between the dummy gate electrode 22n and the aluminum film 36 to substitute the dummy gate electrode 22n of polycrystalline silicon with the gate electrode 34a of aluminum. Concurrently therewith, in the region for the p-channel transistor to be formed in, the aluminum film 36 and the titanium film 44 react with each other to form a TiAl alloy film 46, and the dummy gate electrode 22p of polycrystalline silicon is substituted with the gate electrode 34d of the TiAl alloy (FIG. 13A).

As described above, in the present embodiment, the dummy gate electrodes 22n, 22p are simultaneously substituted, which prevents the inconvenience that when one of the dummy gate electrodes 22n, 22p is substituted, even the other region is substituted. After the substitution, aluminum and TiAl alloy, which are thermally stable, are in contact with each other, which suppress the interdiffusion of the constituent atoms due to later thermal processing.

Figure 13B:
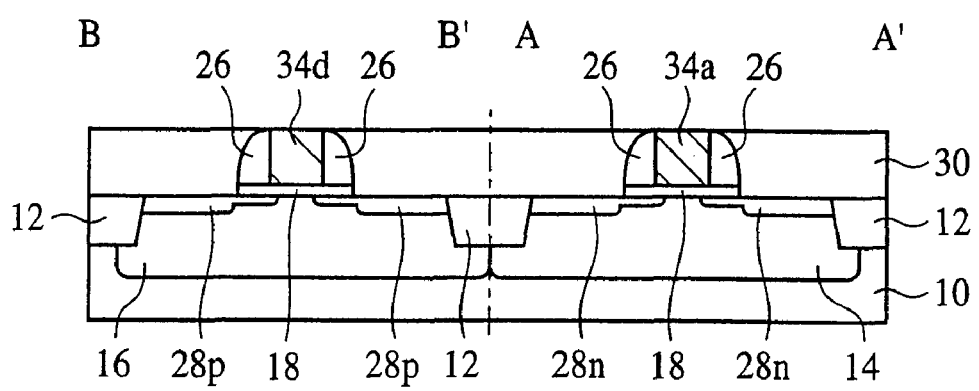

Then, the aluminum film 36 and the TiAl alloy film 46 are polished by, e.g., CMP until the upper surface of the inter-layer insulating film 30 is exposed to remove the aluminum film 36 and the TiAl alloy film 46 on the inter-layer insulating film 30 (FIG. 13B). The aluminum film 36 and the TiAl alloy film 46 may be removed by dry etching and wet etching in place of CMP method.

As described above, according to the present embodiment, the gate electrode of the n-channel transistor is formed of aluminum, and the gate electrode of the p-channel transistor is formed of TiAl alloy, whereby the interdiffusion of the constituent materials between the gate electrode of the n-channel transistor and the gate electrode of the p-channel transistor can be prevented. Accordingly, even in the case that the gate electrode of the n-channel transistor and the gate electrode of the p-channel transistor are formed in one continuous pattern, changes of the work functions of the materials forming the gate electrodes due to the thermal processing after the formation of the gate electrode can be prevented.

In the present embodiment, the patterned titanium film 44 is formed on the aluminum film 36, but the aluminum film 36 may be formed on the patterned titanium film 44.

In the present embodiment, the gate electrode of the p-channel transistor is formed of a TiAl alloy but may be formed of an alloy which has a suitable work function and thermal stable, e.g., TiNi, RuTa, TaAl, MoTa or others. The gate electrode of such alloy may be formed by both the alloying reaction and the substitution or by damascene method as in the second embodiment.

A Fourth Embodiment

The semiconductor device and the method for fabricating the same according to a fourth embodiment of the present invention will be explained with reference to FIGS. 14 to 17B. The same members of the semiconductor device and the method for fabricating the same according to the present embodiment as those of the semiconductor device and the method for fabricating the same according to the first to the third embodiments shown in FIGS. 1 to 13B are represented by the same reference numbers not to repeat or to simplify the explanation.

Figure 14:
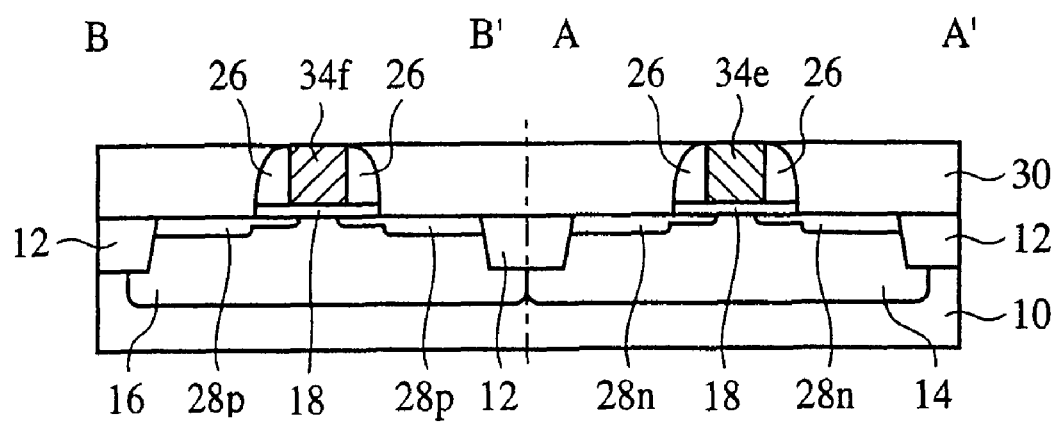
FIG. 14 is a diagrammatic sectional view of the semiconductor device according to a fourth embodiment of the present invention, which shows a structure thereof.

FIG. 14 is a diagrammatic sectional view of the semiconductor device according to the present embodiment. FIGS. 15A to 17B are sectional views of the semiconductor device according to the present embodiment in the steps of the method for fabricating the same, which show the method.

First, the structure of the semiconductor device according to the present embodiment will be explained with reference to FIG. 14.

The semiconductor device according to the present embodiment is the same in the basic structure as the semiconductor device according to the first embodiment shown in FIGS. 1 and 2. The semiconductor device according to the present embodiment is characterized mainly in that the gate electrode 34e of an n-channel transistor is formed of titanium silicide ($TiSi_x$), and the gate electrode 34f of a p-channel transistor is formed of tungsten silicide ($WSi_x$). The gate electrodes are formed of the silicides, whereby the gate interconnection can be less resistive, and the transistor can be faster. The work function of titanium silicide is suitable for the gate electrode of an n-channel transistor, and the work function of tungsten silicide is suitable for the gate electrode of a p-channel transistor.

Refractory metal silicides, such as tungsten silicide, titanium silicide, etc. are thermally very stable, and the metal atoms of both silicides are not interdiffused in thermal processing steps after the formation of the gate electrodes. Accordingly, in the case that the gate electrode 34e of the n-channel transistor is formed of titanium silicide, and the gate electrode 34f of the p-channel transistor is formed of tungsten silicide, the interdiffusion of the constituent materials between the gate electrodes 34e, 34f is very little, whereby even in the case that the gate electrodes 34e, 34f of CMOS circuit are formed in one continuous pattern, changes of the work functions of the gate electrodes 34e, 34f due to thermal processing in multi-level interconnection forming step, etc. can be prevented.

Next, the method for fabricating the semiconductor device according to the present embodiment will be explained with reference to FIGS. 15A to 17B.

Figure 15A:
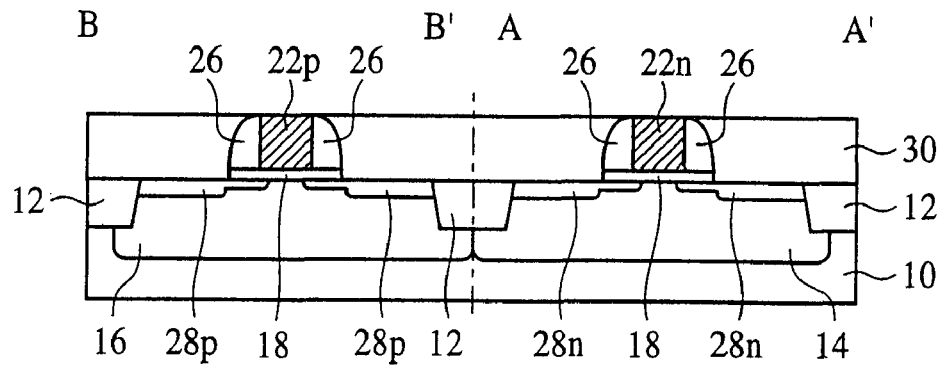
FIGS. 15A-15C, 16A-16C and 17A-17B are sectional views of the semiconductor device according to the fourth embodiment of the present invention in the steps of the method for fabricating the same, which show the method.

First, in the same way as in, e.g., the method for fabricating the semiconductor device according to the first embodiment, a dummy gate electrodes 22n, 22p, an inter-layer insulating film 30, etc. are formed (FIG. 15A).

Next, a silicon oxide film 38 of, e.g., a 100 nm-thick is formed on the entire surface by, e.g., plasma CVD method.

Figure 15B:
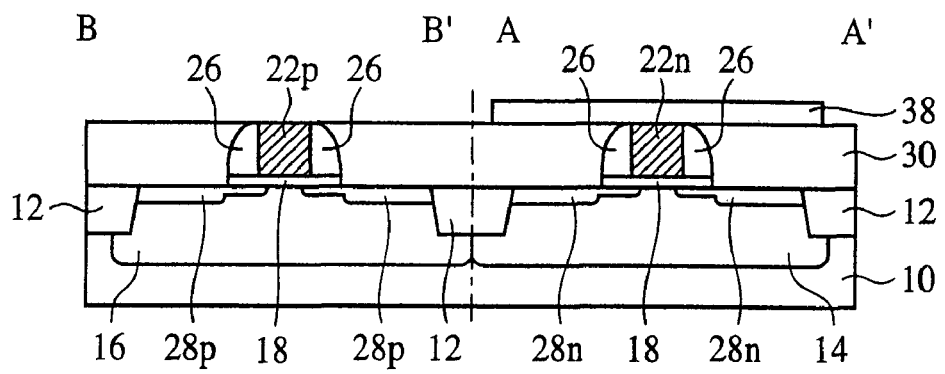

Then, the silicon oxide film 38 is patterned by photolithography and dry etching to leave the silicon oxide film 38 selectively on the dummy gate electrode 22n (FIG. 15B). At this time, the upper surface of the dummy gate electrode 22n must be completely covered.

In place of forming the silicon oxide film 38, the surface of the dummy gate electrode 22n may be selectively oxidized as will be described later in a sixth embodiment.

Figure 15C:
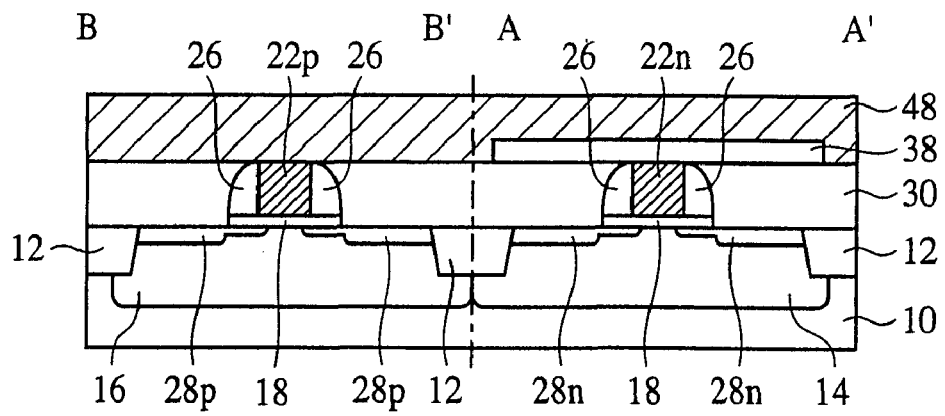

Then, a tungsten film 48 of, e.g., a 200 nm-thick is formed on an inter-layer insulating film 30 with the silicon oxide film 38 formed on (FIG. 15C).

Figure 16A:
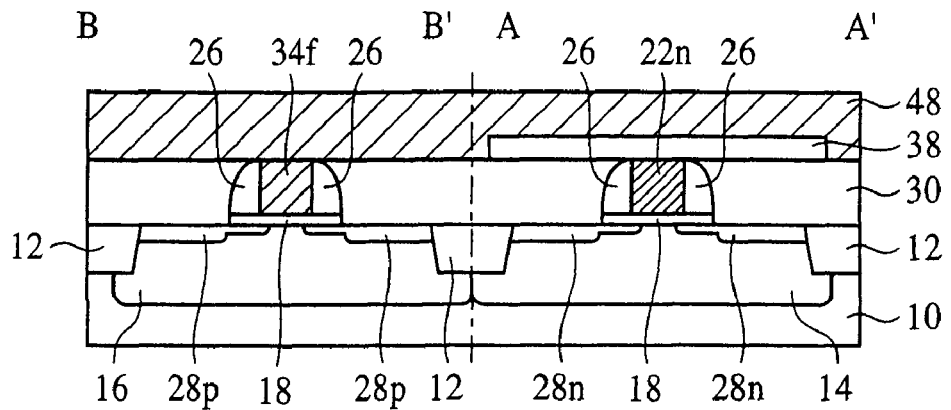

Next, thermal processing is performed for 30 seconds in a nitrogen atmosphere at, e.g., 1100° C. This thermal processing starts the silicidation reaction from the interface between the dummy gate electrode 22p and the tungsten film 48 to substitute the dummy gate electrode 22p of polycrystalline silicon with the gate electrode 34f of tungsten silicide ($WSi_x$) (FIG. 16A). The silicidation reaction does not take place on the dummy gate electrode 22n, on which the silicon oxide film 38 is formed.

Figure 16B:
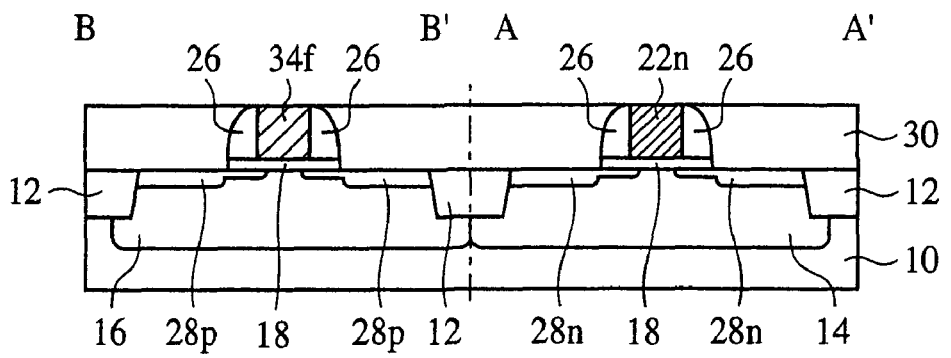

Then, the tungsten film 48 and the silicon oxide film 38 are polished by, e.g., CMP method until the upper surface of the inter-layer insulating film 30 is exposed to remove the tungsten film 48 and the silicon oxide film 38 on the inter-layer insulating film 30 (FIG. 16B). The tungsten film 48 and the silicon oxide film 38 may be removed by dry etching or wet etching in place of CMP method.

Figure 16C:
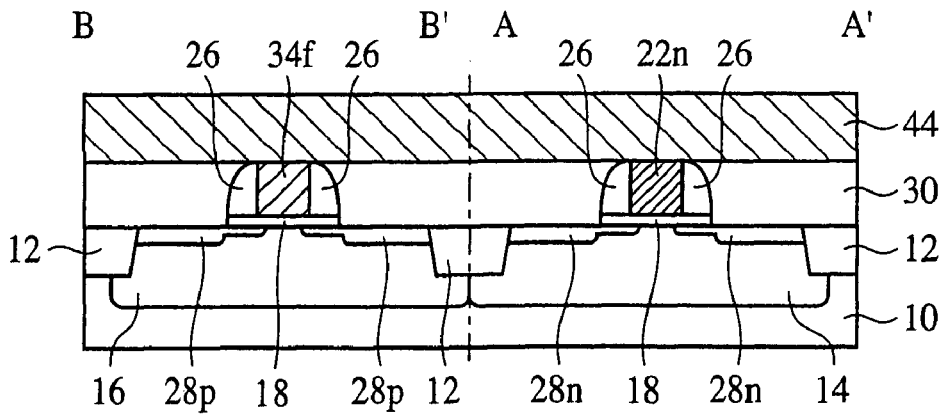

Next, a titanium film 44 of, e.g., a 200 nm-thick is formed on the inter-layer insulating film 30 by, e.g., sputtering method (FIG. 16C).

Figure 17A:
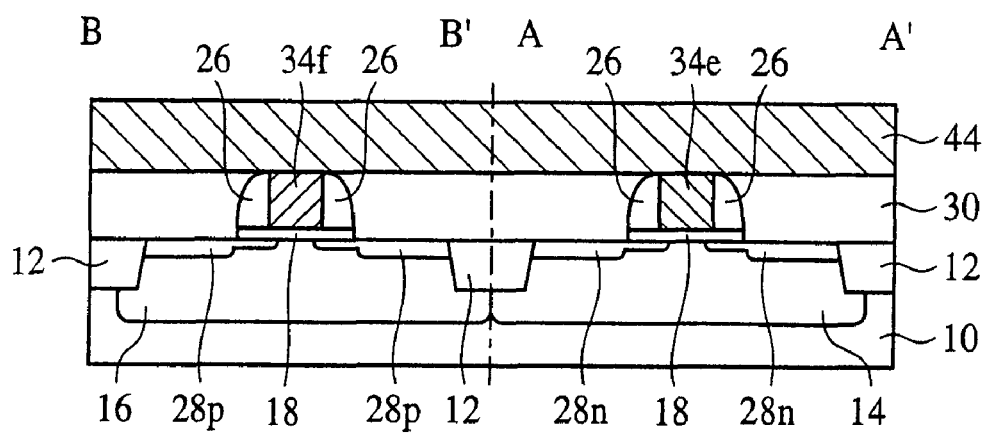

Then, thermal processing is performed in a nitrogen atmosphere for 30 seconds at, e.g., 1000° C. This thermal processing starts the silicidation reaction from the interface between the dummy gate electrode 22n and the titanium film 44 to substitute the dummy gate electrode 22n of polycrystalline silicon with the gate electrode 34e of titanium silicide ($TiSi_x$) (FIG. 17A).

At this time, tungsten silicide, which is thermally very stable, does not react with the titanium film 44 or the titanium silicide forming the gate electrode 34e. Accordingly, the n-channel transistor and the p-channel transistor have the gate electrodes 34e, 34f formed of the materials having respective required work functions, whereby the operation of the CMOS transistors can be controlled with high accuracy.

Titanium is reductive to silicon oxide film, so that when the silicon oxide film 38 is sufficiently thin, the dummy gate electrode 22n can be substituted with the gate electrode 34e of titanium silicide without removing the silicon oxide film 38.

Figure 17B:
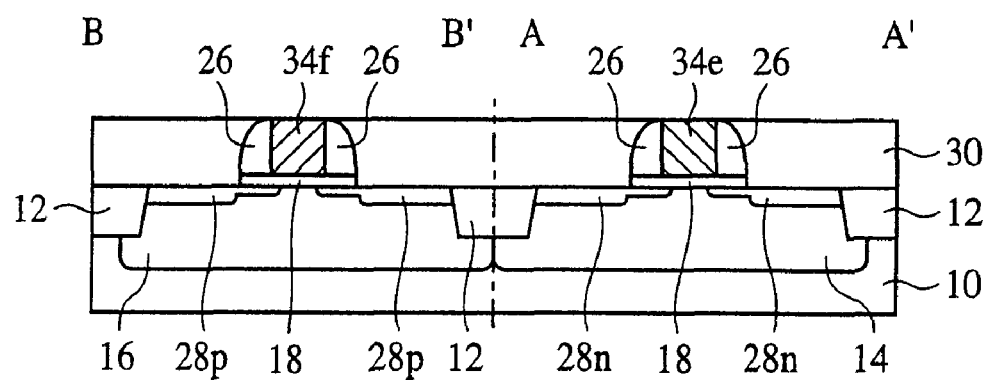

Then, until the upper surface of the inter-layer insulating film 30 is exposed, the titanium film 44 is polished by, e.g., CMP method to remove the titanium film 44 on the inter-layer insulating film 30 (FIG. 17B). The titanium film 44 may be removed by dry etching or wet etching in place of CMP method.

As described above, according to the present embodiment, the gate electrode of the n-channel transistor is formed of titanium silicide, and the gate electrode of the p-channel transistor is formed of tungsten silicide, whereby the interdiffusion of the constituent materials between the gate electrode of the n-channel transistor and the gate electrode of the p-channel transistor can be prevented. Even in the case that the gate electrode of the n-channel transistor and the gate electrode of the p-channel transistor are formed in one continuous pattern, changes of the work functions of the materials forming the gate electrodes due to thermal processing after the formation of the gate electrodes can be prevented.

In the present embodiment, the gate electrode of the n-channel transistor is formed of titanium silicide, and the gate electrode of the p-channel transistor is formed of tungsten silicide but may be formed of other silicides which are thermally stable and have suitable work functions, e.g., ZrSi, HfSi, VSi, NbSi, TaSi, CrSi, MoSi, FeSi, CoSi, NiSi, RuSi, RhSi, PdSi, ReSi, OsSi, IrSi, PtSi or others. The gate electrodes of such silicides may be formed by silicidation reaction as in the present embodiment or damascene method as in the second embodiment.

A Fifth Embodiment

The semiconductor device and the method for fabricating the same according to a fifth embodiment of the present invention will be explained with reference to FIGS. 18 to 21C. The same members of the semiconductor device and the method for fabricating the same according to the present embodiment as those of the semiconductor device and the method for fabricating the same according to the first to the fourth embodiments shown in FIGS. 1 to 17B are represented by the same reference numbers not to repeat or to simplify their explanation.

Figure 18:
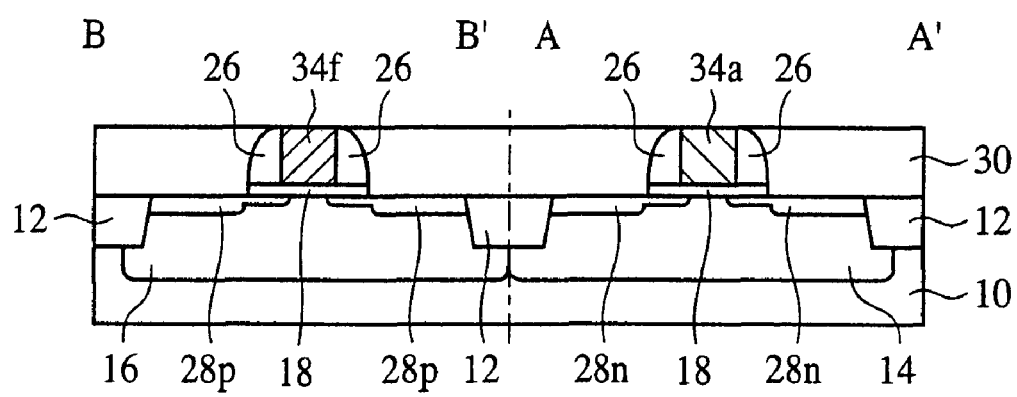
FIG. 18 is a diagrammatic sectional view of the semiconductor device according to a fifth embodiment of the present invention, which shows a structure thereof.

FIG. 18 is a diagrammatic sectional view of the semiconductor device according to the present embodiment, which shows a structure thereof. FIGS. 19A to 21C are sectional views of the semiconductor device in the steps of the method for fabricating the same, which show the method.

First, the structure of the semiconductor device according to the present embodiment will be explained with reference to FIG. 18.

The semiconductor device according to the present embodiment is the same in the basic structure as the semiconductor device according to the first embodiment shown in FIGS. 1 and 2. The semiconductor device according to the present embodiment is characterized mainly in that the gate electrode 34$f$ of a p-channel transistor is formed of tungsten silicide (WSi$_x$), and as in the first embodiment, the gate electrode 34$a$ of an n-channel transistor is formed of aluminum.

Tungsten silicide is a thermally very stable compound and does not react with aluminum in thermal processing steps after the formation of the gate electrodes. Accordingly, in the case that aluminum is used for the gate electrode 34$a$ of the n-channel transistor, and tungsten silicide is used for the gate electrode 34$f$ of the p-channel transistor, the interdiffusion of the constituent materials between the gate electrodes 34$a$, 34$f$ is so little that even in the case that the gate electrodes 34$a$, 34$f$ for forming CMOS circuit are formed in one continuous pattern, changes of the work functions of the gate electrodes 34$a$, 34$f$ due to thermal processing for multi-level interconnections step, etc. can be prevented.

Then, the method for fabricating the semiconductor device according to the present embodiment will be explained with reference to FIGS. 19A to 21C.

Figure 19A:
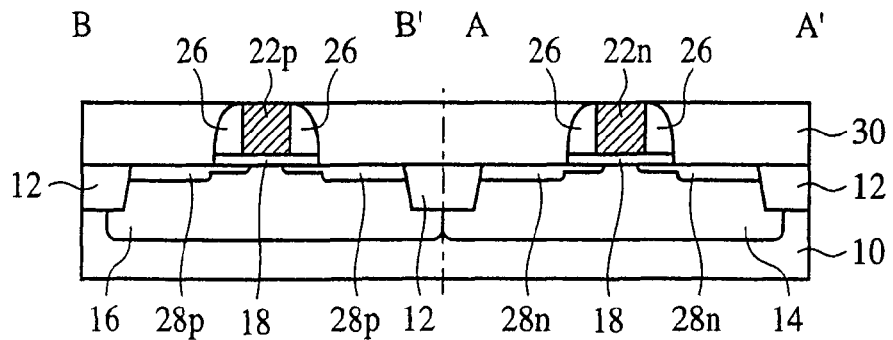
FIGS. 19A-19C, 20A-20C and 21A-21C are sectional views of the semiconductor device according to the fifth embodiment of the present invention in the steps of the method for fabricating the same, which show the method.

First, in the same way as in, e.g., the method for fabricating the semiconductor device according to the first embodiment shown in FIGS. 3A to 4C, the dummy gate electrodes 22$n$, 22$p$, the inter-layer insulating film 30, etc. are formed (FIG. 19A).

Then, a silicon oxide film 38 of, e.g., a 100 nm-thick is formed on the entire surface by, e.g., plasma CVD method.

Figure 19B:
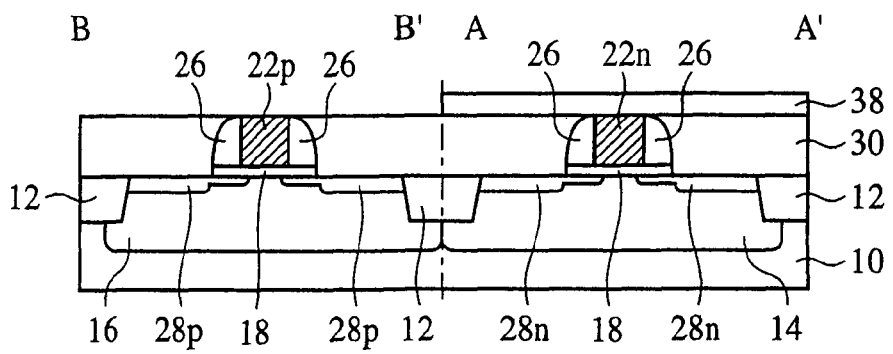

Then, the silicon oxide film 38 is patterned by photolithography and dry etching to leave the silicon oxide film 38 selectively on the dummy gate electrode 22$n$ (FIG. 19B). At this time, the upper surface of the dummy gate electrode 22$n$ must be completely covered.

Figure 19C:
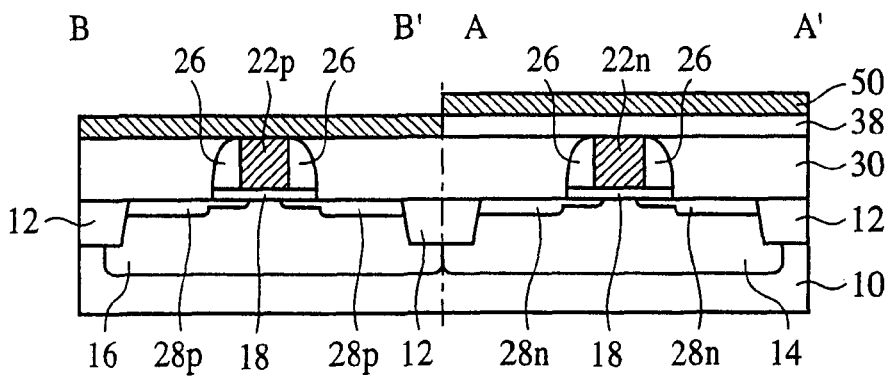

Next, a tantalum film 50 of, e.g., a 5 nm-thick is formed by, e.g., sputtering method on the inter-layer insulating film 30 with the silicon oxide film 38 formed on (FIG. 19C).

Figure 20A:
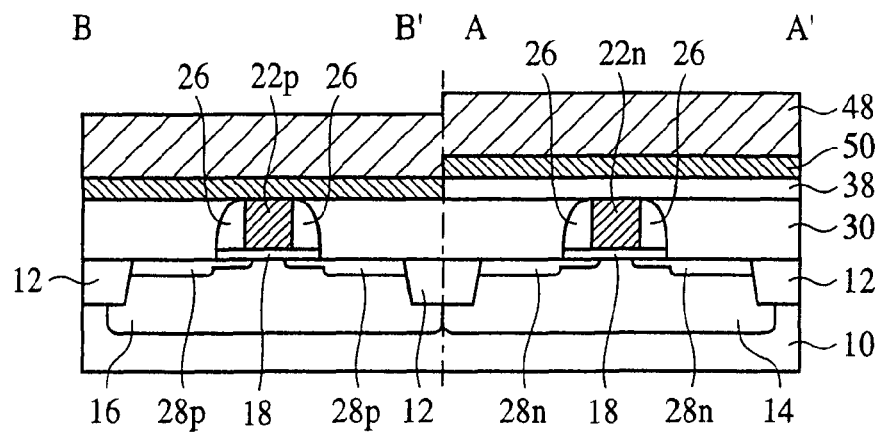
Figure 20B:
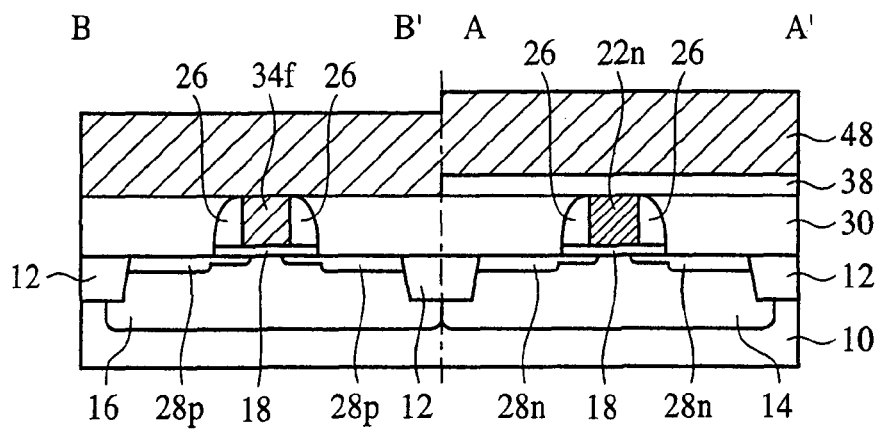
Figure 20C:
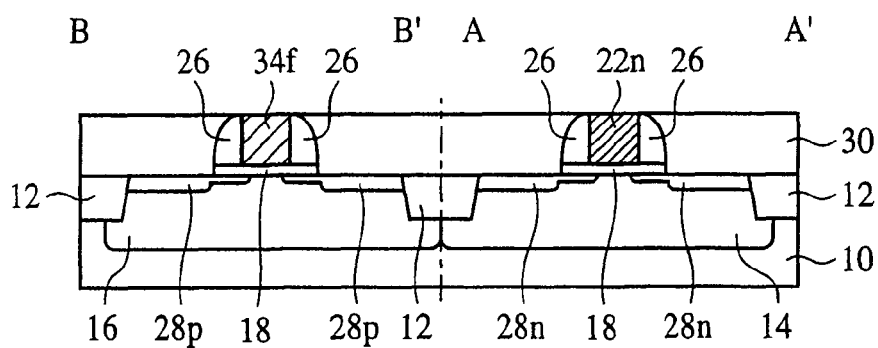

Next, a tungsten film 48 of, e.g., a 200 nm-thick is formed on the tantalum film 50 by, e.g., sputtering method (FIG. 20C).

The tantalum film 50 is for improving the adhesion of the tungsten film 48 to the inter-layer insulating film 30 and the silicon oxide film 38. The adhesion of the tungsten film to the silicon oxide film depends on composition ratio between the silicon and the oxygen. With a higher ratio of the oxygen to the silicon, the adhesion tends to lower. When the adhesion is insufficient, it is preferable to form the tantalum film 50 below the tungsten film 48, as in the present embodiment.

Then, thermal processing is performed in a nitrogen atmosphere for 30 seconds at, e.g., 1100° C. This thermal processing starts the silicidation reaction from the interface between the dummy gate electrode 22$p$ and the tantalum film 50 to substitute the dummy gate electrode 22$p$ of polycrystalline silicon with the gate electrode 34$f$ of tungsten silicide (WSi$_x$). The tantalum film 50 is diffused into the tungsten film 48 to be merged therein (FIG. 20B).

With the tantalum film formed therebetween, in the thermal processing step, the tantalum film 50 as well is substituted with the silicon or have the silicidation reaction. Accordingly, the film thickness, etc. of the tantalum film are preferably adjusted so that the work function of the gate electrode 34$f$ does not vary from a required value.

Then, the tungsten film 48 and the silicon oxide film 38 are polished by, e.g., CMP method until the upper surface of the inter-layer insulating film 30 is exposed to remove the tungsten film 48 and the silicon oxide film 38 on the inter-layer insulating film 30 (FIG. 20C). The tungsten film 48 and the silicon oxide film 38 may be removed by dry etching or wet etching in place of CMP method.

Figure 21A:
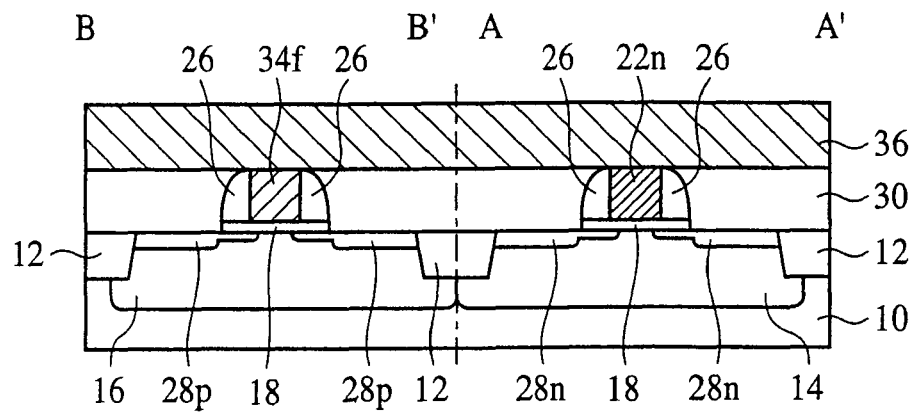

Next, an aluminum film 36 of, e.g., a 400 nm-thick is formed on the inter-layer insulating film 30 by, e.g., sputtering method (FIG. 21A).

Figure 21B:
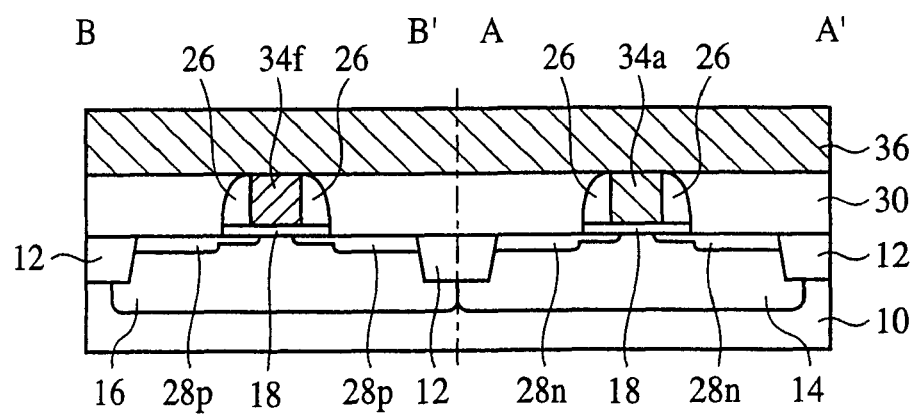

Then, thermal processing is performed for 30 minutes in a nitrogen atmosphere in a 350~500° C. temperature range, e.g., at 400° C. This thermal processing starts the reaction from the interface between the dummy gate electrode 22$n$ and the aluminum film 36 to substitute the dummy gate electrode 22$n$ of polycrystalline silicon with the gate electrode 34$a$ of aluminum (FIG. 21B).

At this time, the gate electrode 34$f$ does not react with the aluminum film 36 or the gate electrode 34$a$, because tungsten silicide is thermally very stable. Thus, the n-channel transistor and the p-channel transistor have the gate electrodes 34$a$, 34$f$ formed of the materials respectively of required work functions, whereby the operation of the CMOS transistors can be controlled with high accuracy.

Figure 21C:
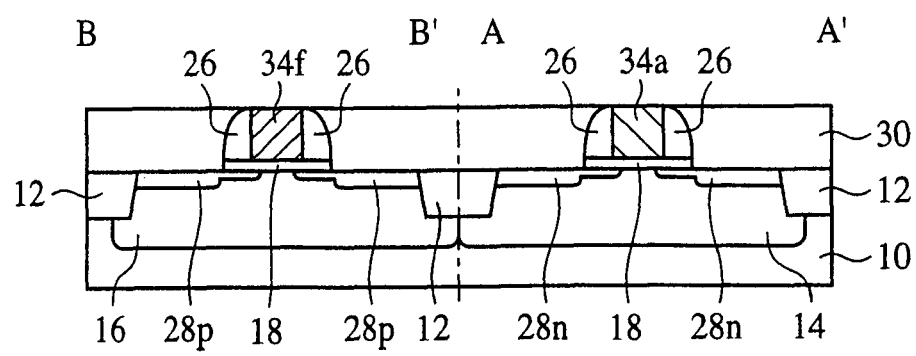

Then, the aluminum film 36 is polished by, e.g., CMP method until the upper surface of the inter-layer insulating film 30 is exposed to remove the aluminum film 36 on the inter-layer insulating film 30 (FIG. 21C). The aluminum film 36 may be removed by dry etching or wet etching in place of CMP method.

As described above, according to the present embodiment, the gate electrode of the n-channel transistor is formed of aluminum, and the gate electrode of the p-channel transistor is formed of tungsten silicide, whereby the interdiffusion of the constituent materials between the gate electrode of the n-channel transistor and the gate electrode of the p-channel transistor can be prevented. Accordingly, even in the case that the gate electrode of the n-channel transistor and the gate electrode of the p-channel transistor are formed in one continuous pattern, changes of the work functions of the materials forming the gate electrodes due to thermal processing after the formation of the gate electrodes can be prevented.

A Sixth Embodiment

The semiconductor device and the method for fabricating the same according to a sixth embodiment of the present invention will be explained with reference to FIGS. 22 to 25C. The same members of the semiconductor device and the method for fabricating the same according to the present embodiment as those of the semiconductor device and the method for fabricating the same according to the first to the fifth embodiments shown in FIGS. 1 to 21C are represented by the same reference numbers not to repeat or to simplify their explanation.

Figure 22:
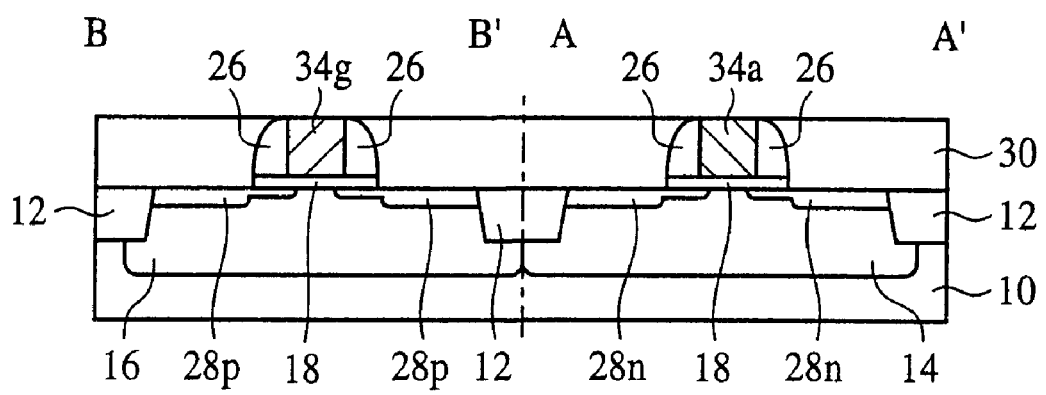
FIG. 22 is a diagrammatic sectional view of the semiconductor device according to a sixth embodiment of the present invention, which shows a structure thereof.

FIG. 22 is a diagrammatic sectional view of the semiconductor device according to the present embodiment, which shows a structure thereof. FIGS. 23A to 25C are sectional views of the semiconductor device according to the present embodiment, which show the structure thereof.

First, the structure of the semiconductor device according to the present embodiment will be explained with reference to FIG. 22.

The semiconductor device according to the present embodiment is the same in the basic structure as the semiconductor device according to the first embodiment shown in FIGS. 1 and 2. The semiconductor device according to the present embodiment is characterized mainly in that the gate electrode 34g of a p-channel transistor is formed of molybdenum (Mo). The gate electrode 34a of an n-channel transistor is formed of aluminum, as in the first embodiment.

The gate electrode 34g of the p-channel transistor is formed of molybdenum, whereby the gate interconnection can be less resistive, and the p-channel transistor can be speedy. The work function of molybdenum is suitable for the gate electrode of the p-channel transistor.

The diffusion rate of aluminum atoms in molybdenum and the diffusion rate of molybdenum atoms in aluminum are so low that the interdiffusion between the constituent materials between the gate electrodes 34a, 34g is very little. Accordingly, even in the case that the gate electrodes 34a, 34g of CMOS circuit are formed in one continuous pattern, changes of the work functions of the gate electrodes 34a, 34g due to thermal processing in multi-level interconnection forming step, etc. can be prevented.

Next, the method for fabricating the semiconductor device according to the present embodiment will be explained with reference to FIGS. 23A to 25C.

Figure 23A:
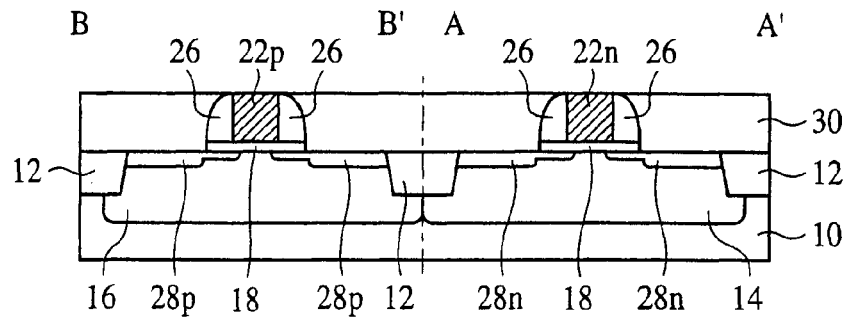
FIGS. 23A-23C, 24A-24C and 25A-25C are sectional views of the semiconductor device according to the sixth embodiment of the present invention in the steps of the method for fabricating the same, which show the method.

First, in the same way as in, e.g., the method for fabricating the semiconductor device according to the first embodiment shown in FIGS. 3A to 4C, dummy gate electrodes 22n, 22p, the inter-layer insulating film 30, etc. are formed (FIG. 23A).

Then, a photoresist film 52 covering selectively the upper surface of the dummy gate electrode 22p is formed on the inter-layer insulating film 30 by photolithography.

Figure 23B:
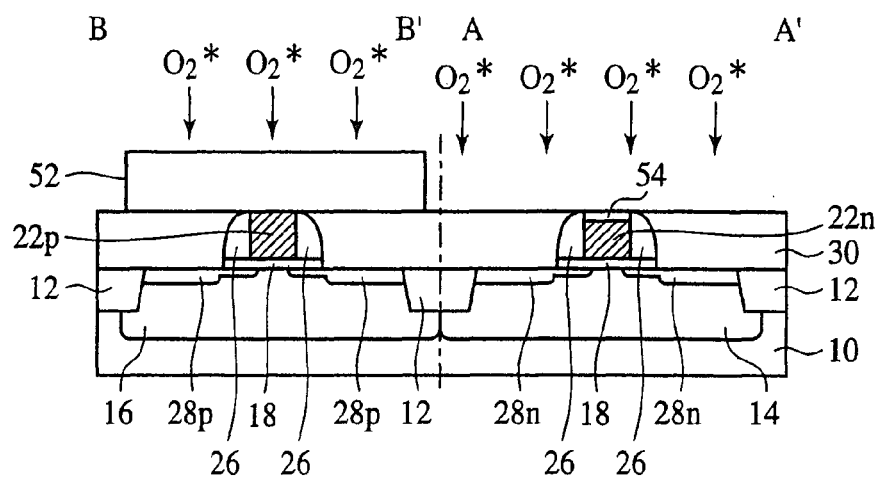
Figure 23C:
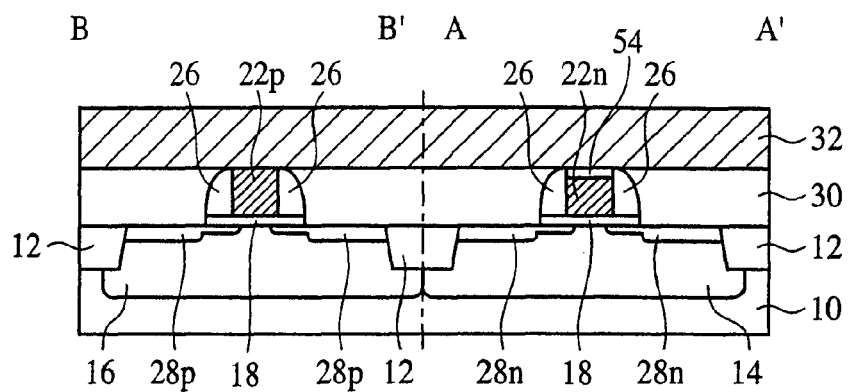

Next, with the photoresist film 52 as the mask, oxygen plasma processing is performed to form the silicon oxide film 54 selectively on the upper surface of the dummy gate electrode 22n (FIG. 23B). Thus, the upper surface of the gate electrode 22n is completely covered with the silicon oxide film 54.

Then, the photoresist film 52 is removed by, e.g., plasma aching. The photoresist film may be simultaneously removed by the oxygen plasma processing for forming the silicon oxide film 54.

Next, a molybdenum film 32 of, e.g., a 500 nm-thick is deposited on the inter-layer insulating film 30 by, e.g., sputtering method.

Next, thermal processing performed for 30 minutes in a nitrogen atmosphere in a 700~900° C., e.g., at 700° C. This thermal processing starts the reaction from the interface between the dummy gate electrode 22p and the molybdenum film 32 to substitute the dummy gate electrode 22p of polycrystalline silicon with the gate electrode 34g of molybdenum. In this thermal processing, the dummy gate electrode 22n, which is covered with the silicon oxide film 54, is not substituted with molybdenum.

In the silicidation reaction between a metal and silicon, a diffusion species is decided by reaction temperature. In molybdenum, for example, as described in the first embodiment, the diffusion species in the thermal processing of a low temperature of below about 550° C. is molybdenum, and the molybdenum atoms are diffused into the dummy gate electrode 22p to form molybdenum silicide. On the other hand, in the thermal processing of a high temperature of above 700° C. as in the present embodiment, the diffusion species is silicon, and the silicon atoms in the dummy gate electrode 22p are diffused into the molybdenum film 32 to substitute the dummy gate electrode 22p with molybdenum. The silicon atoms diffused into the molybdenum film 32 form molybdenum silicide film on the surface of the molybdenum film 32. The thermal processing temperature is suitably set, whereby the dummy gate electrode 22p can be substituted with silicide or metal. The phenomena of the diffusion between a metal and silicon are described in, e.g., Reference 6 (S. P. Murarka, Silicides for VLSI Applications, Academic Press, Inc., pp. 88~95).

Figure 24A:
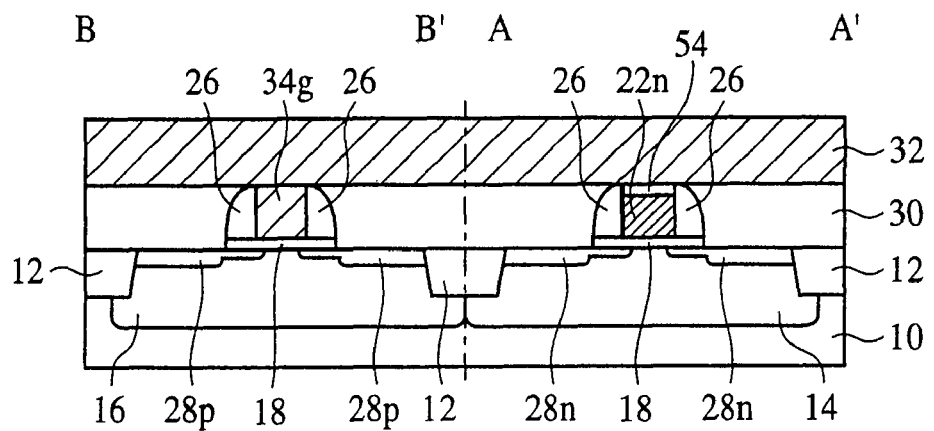
Figure 24B:
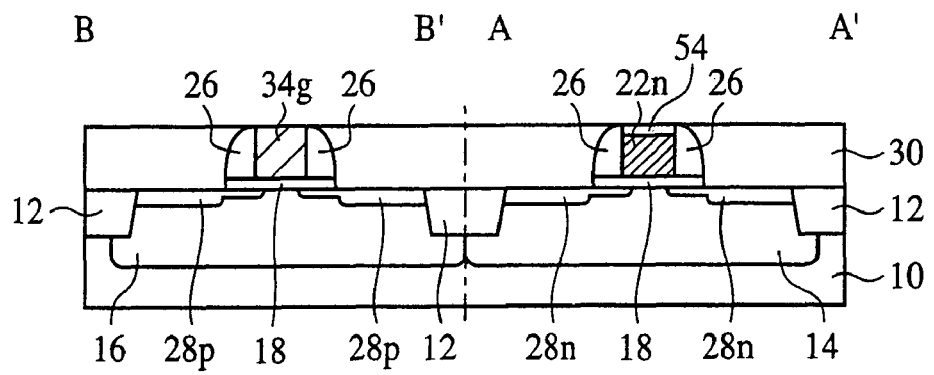

Then, the molybdenum film 32 is polished by, e.g., CMP method until the upper surface of the inter-layer insulating film 30 is exposed to remove the molybdenum film 32 on the inter-layer insulating film 30 (FIG. 24B). The molybdenum film 32 may be removed by dry etching or wet etching in place of CMP method.

Figure 24C:
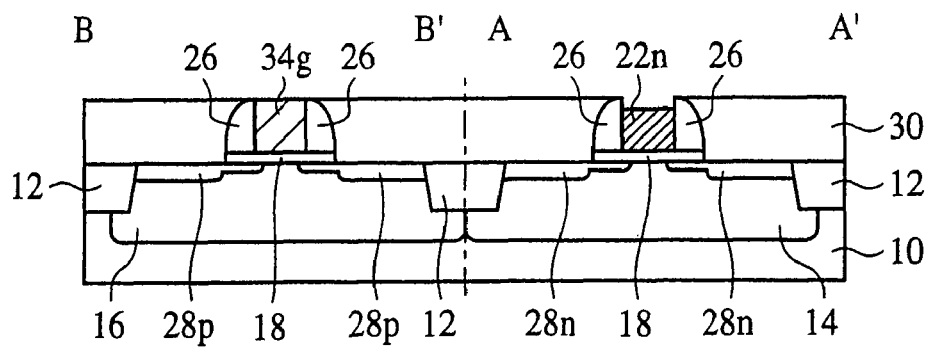

Next, the silicon oxide film 54 is selectively removed by dry etching or wet etching to expose the upper surface of the dummy gate electrode 22n (FIG. 24C).

Figure 25A:
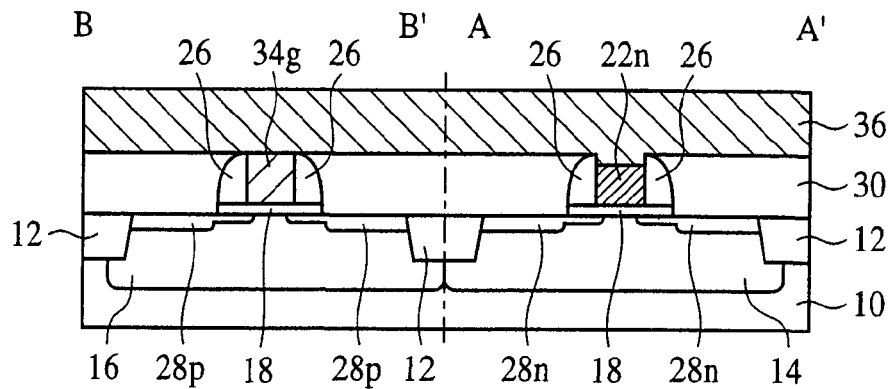

Next, an aluminum film 36 of, e.g., a 400 nm-thick is formed on the inter-layer insulating film 30 by, e.g., sputtering method (FIG. 25A).

Figure 25B:
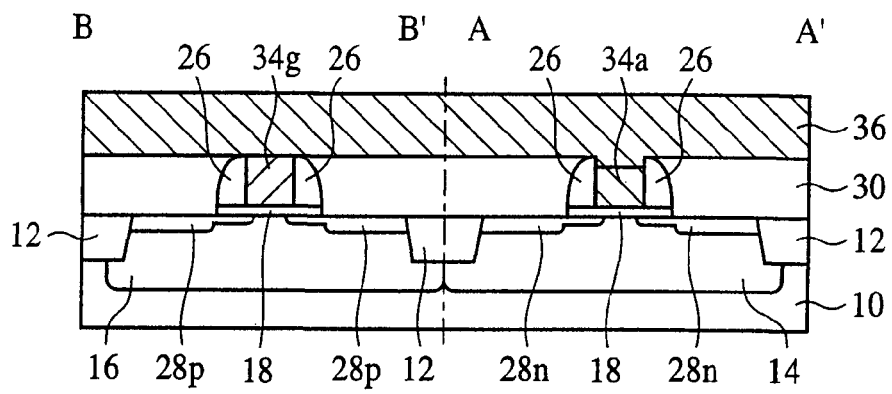

Then, thermal processing is performed for 30 minutes in a nitrogen atmosphere in a 350~500° C. temperature range, e.g., at 400° C. This thermal processing starts the reaction from the interface between the dummy gate electrode 22n and the aluminum film 36 to substitute the dummy gate electrode 22n of polycrystalline silicon with the gate electrode 34a of aluminum (FIG. 25B).

At this time, the diffusion rate of the aluminum atoms in molybdenum is so low that it does not happened that the aluminum atoms are diffused in the gate electrode 34g resultantly to influence the work function of the gate electrode 34g. Even in thermal processing to be performed in later multi-level interconnection forming step, the aluminum atoms are not diffused in molybdenum. Molybdenum, which is a thermally very stable refractory metal, and the molybdenum atoms are not diffused in aluminum. Accordingly, the n-channel transistor and the p-channel transistor have the gate electrodes 34a, 34g formed of the materials respectively of required work functions, whereby the operation of the CMOS transistors can be controlled with high accuracy.

Figure 25C:
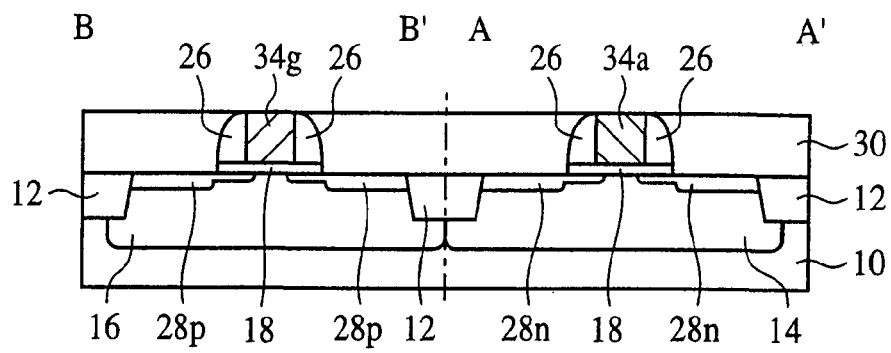

Next, the aluminum film 36 is polished by, e.g., CMP method until the upper surface of the inter-layer insulating film 30 is exposed to remove the aluminum film 36 on the inter-layer insulating film 30 (FIG. 25C). The aluminum film 36 may be removed by dry etching or wet etching in place of CMP method.

It is preferable to perform the string of processes for substituting the dummy gate electrode 22p with molybdenum before the string of processes for substituting the dummy gate electrode 22n with aluminum. This is because the melting point of aluminum is low and cannot stand the thermal processing step for substituting the dummy gate electrode 22p with molybdenum.

As described above, according to the present embodiment, the gate electrode of the n-channel transistor is formed of aluminum, and the gate electrode of the p-channel transistor is formed of molybdenum, whereby the interdiffusion of the constituent materials between the gate electrode of the n-channel transistor and the gate electrode of the p-channel transistor can be prevented. Accordingly, even in the case that the gate electrode of the n-channel transistor and the gate electrode of the p-channel transistor are formed in one continuous pattern, changes of the work functions of the materials forming the gate electrodes due to thermal processing after the formation of the gate electrodes can be prevented.

In the present embodiment, the gate electrode of the p-channel transistor is formed of molybdenum, and the gate electrode of the n-channel transistor is formed of aluminum but may formed of a thermally stable metal having a suitable work function, e.g., titanium, zirconium (Zr), hafnium (Hf), vanadium (V), niobium (Nb), tantalum, chrome (Cr), tungsten, iron (Fe), cobalt, nickel (Ni), platinum, palladium (Pd) or others. In the case that a material, such as titanium or others, which is reductive to silicon oxide film, the thickness of the protection film (silicon oxide film 54) covering the upper surface of the dummy gate electrode 22n is preferably large.

In the present embodiment, the silicon oxide film 54 covering the upper surface of the dummy gate electrode 22n is formed by oxygen plasma processing but may be formed by thermal processing in an oxygen atmosphere as silicon oxide film is usually formed, and in this case, in place of the photoresist film 54, another film as the oxidation mask, e.g., a silicon nitride film may be formed. In place of forming the silicon oxide film 54, native oxide film on the dummy gate electrode 22p may be selectively removed. The substitution of the polycrystalline silicon with molybdenum can be prevented by a very thin protection film, such as native oxide film.

In the present embodiment, the protection film covering the upper surface of the dummy gate electrode 22n is the silicon oxide film 54. However silicon oxide film is not essential and can be any film as long as the film can suppress the reaction between the polycrystalline silicon and molybdenum. Silicon nitride film, for example, can be used.

A Seventh Embodiment

The semiconductor device and the method for fabricating the same according to a seventh embodiment of the present invention will be explained with reference to FIGS. 26 to 27C. The same members of the semiconductor device and the method for fabricating the same according to present embodiment as those of the semiconductor device and the method for fabricating the same according to the first to the sixth embodiments shown in FIGS. 1 to 25C are represented by the same reference numbers not to repeat or to simplify their explanation.

Figure 26:
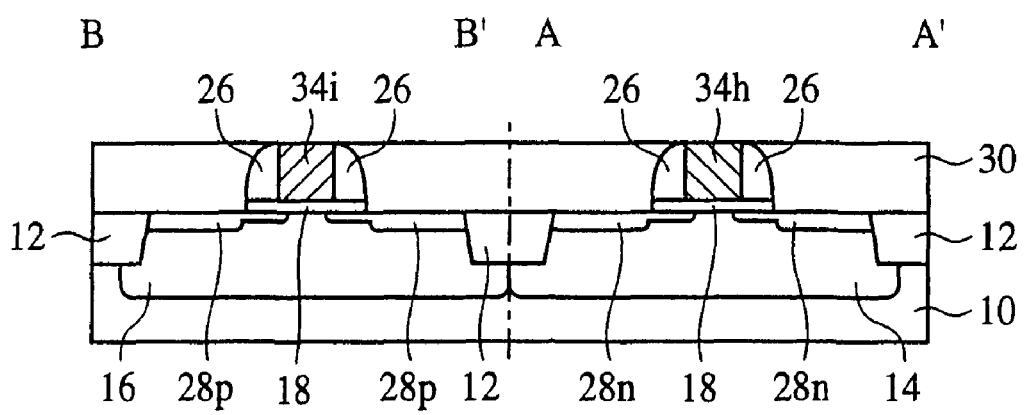
FIG. 26 is a diagrammatic sectional view of the semiconductor device according to a seventh embodiment of the present invention, which shows the structure thereof.
Figure 27A:
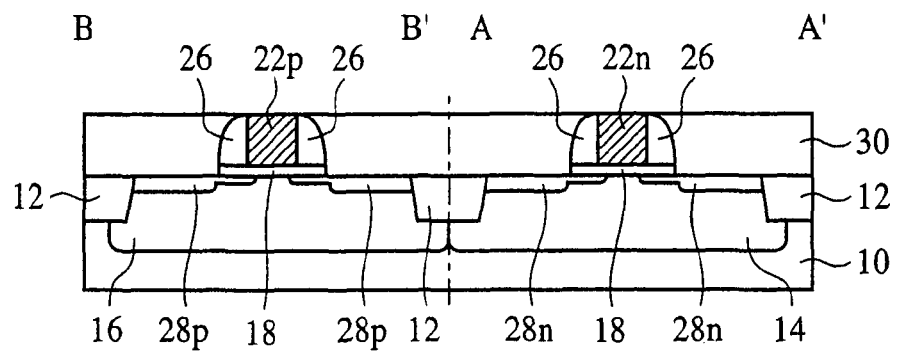
FIGS. 27A-27C are sectional views of the semiconductor device according to the seventh embodiment of the present invention in the steps of the method for fabricating the same, which show the method.
Figure 27B:
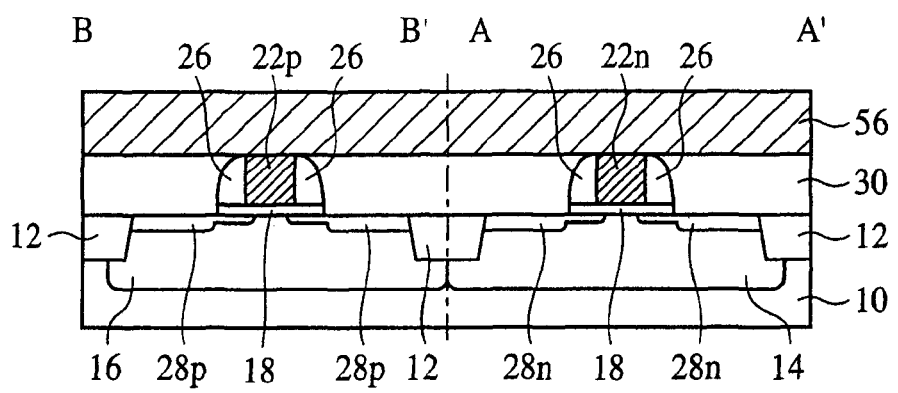
Figure 27C:
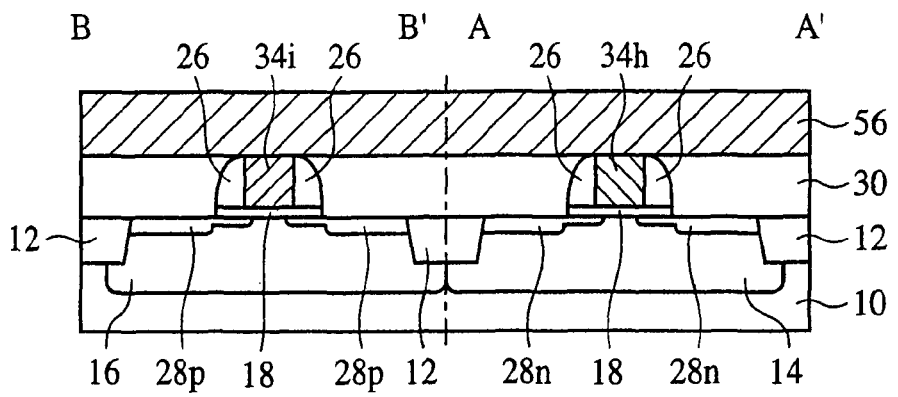

FIG. 26 is a diagrammatic sectional view of the semiconductor device according to the present embodiment, which shows a structure thereof. FIGS. 27A-27C are sectional views of the semiconductor device according to the present embodiment in the steps of the method for fabricating the same, which show the method.

First, the structure of the semiconductor device according to the present embodiment will be explained with reference to FIG. 26.

The semiconductor device according to the present embodiment is the same in the basic structure as the semiconductor device according to the first embodiment shown in FIGS. 1 and 2. The semiconductor device according to the present embodiment is characterized mainly in that the gate electrode 34h of an n-channel transistor is formed of nickel silicide (NiSi$_x$) containing arsenic (As), and the gate electrode 34i of a p-channel transistor is formed of nickel silicide containing boron. The gate electrodes which are even formed of the same silicide have the work function varied depending on different impurities contained in the silicide. Accordingly, by suitably selecting the impurities to be added to the silicide, the work function of the silicide can be controlled to be suitable as the work function of the n-channel transistor and as the work function of the p-channel transistor. The addition of arsenic makes the work function of nickel silicide suitable for the n-channel transistor, and the addition of boron makes the work function of nickel silicide suitable for the p-channel transistor. The change of the work function of nickel silicide by the impurity addition is described in, e.g., Reference 7 (Ming Quin et al., Journal of The Electrochemical Society, 148(5) pp. G271~G274 (2001)).

Forming the gate electrode of nickel silicide is effective also to make the gate interconnection less resistive.

Next, the method for fabricating the semiconductor device according to the present embodiment will be explained with reference to FIGS. 27A-27C.

First, in the same way as in, e.g., the method for fabricating the semiconductor device according to the first embodiment shown in FIGS. 3A to 4C, dummy gate electrodes 22n, 22p, an inter-layer insulating film 30, etc. are formed (FIG. 27A).

Arsenic has been doped in the dummy gate electrode 22n in forming the source/drain diffused layers 28n. Similarly Boron has been doped in the dummy gate electrode 22p in forming the source/drain diffused layers 28p. Next, a nickel film 56 of, e.g., a 30 nm-thick is formed on the entire surface by, e.g., sputtering method (FIG. 27B).

Next, thermal processing is performed for 3 minutes in a nitrogen atmosphere at, e.g., 400° C. to react the polycrystalline silicon film 20 forming the dummy gate electrodes 22n, 22p with the nickel film 56. At this time, the impurities present in the dummy gate electrodes 22n, 22p reside there. Thus, the dummy gate electrode 22n is substituted with the gate electrode 34h containing arsenic, and the dummy gate electrode 22p is substituted with the gate electrode 34i containing boron (FIG. 27C).

Then, the nickel film 56 which has not reacted is removed by wet etching. Thus, the semiconductor device shown in FIG. 26 is fabricated.

The impurities added to the gate electrodes 34h, 34i are not interdiffused in the thermal processing in later multi-level interconnection forming step, and the gate electrodes 34h, 34i can retain the respective work functions constant.

As described above, according to the present embodiment, the gate electrode of the n-channel transistor is formed of nickel silicide with arsenic added to, and the gate electrode of the p-channel transistor is formed of nickel silicide with boron added to, whereby the interdiffusion of the constituent materials between the gate electrode of the n-channel transistor and the gate electrode of the p-channel transistor can be prevented. Accordingly, even in the case that the gate electrode of the n-channel transistor and the gate electrode of the p-channel transistor are formed in one continuous pattern, changes of the work functions of the materials forming the gate electrodes due to the thermal processing after the formation of the gate electrodes can be prevented.

In the present embodiment, the gate electrodes are formed of nickel silicide but may be formed of cobalt silicide. The work function of cobalt silicide can be also controlled by the addition of impurities.

Modified Embodiments

The present invention is not limited to the above-described embodiments and can cover other various modifications.

For example, in the above-described embodiments, the dummy gate electrode 22p of the p-channel transistor is substituted first, and next the dummy gate electrode 22n of the n-channel transistor is substituted. However, which is to be substituted first can be suitably decided depending on constituent materials, etc. of the gate electrodes to be formed. To prevent the interdiffusion between the constituent materials it is preferable that the dummy gate electrode which requires a higher temperature for substituting the constituent material is first substituted, and then the dummy gate electrode whose temperature for substituting the constituent material is low is substituted. Even in the case that a temperature of the constituent material of one of the dummy gate electrodes may cause the interdiffusion between the constituent materials, the constituent material of the dummy gate electrode requiring a higher temperature for the substitution of the constituent material is first substituted, whereby the interdiffusion between the constituent materials can be effectively prevented.

In the above-described embodiments, when the dummy gate electrode 22n is substituted with aluminum, the aluminum film 36 alone is deposited for the thermal processing, but a transition metal film, such as a titanium film, tungsten film, molybdenum film, cobalt film, tantalum film, copper film or others, may be formed on the aluminum film. Such metals act to take in the silicon forming the dummy gate electrode 22n. Accordingly, the substitution rate of the dummy gate electrode 22n can be increased by the formation of such the metal film on the aluminum film 36. This technique is described in, e.g., Reference 5 (Japanese published unexamined patent application No. 2001-274379).

In the above-described embodiments, the metal film (the aluminum film 36 and the titanium film 44) used in substituting the dummy gate electrode 22n is removed by CMP method. However, these films may be patterned without removing by photolithography and dry etching, whereby these films can be also used as interconnections.

In the above-described embodiments, the gate electrode of the n-channel transistor and the gate electrode of the p-channel transistor are formed in one continuous pattern. However, the present invention is applicable to cases where the gate electrode of the n-channel transistor and the gate electrode of the p-channel transistor are formed in discrete patterns.

What is claimed is:

1. A semiconductor device comprising:
   a first transistor of an n-type including a first gate electrode formed of a first metal silicide, and
   a second transistor of a p-type including a second gate electrode formed of a second metal silicide a reaction temperature of which is higher than that of the first metal silicide;
   wherein the first gate electrode and the second gate electrode are formed in one continuous pattern.

2. The semiconductor device according to claim 1, wherein the first metal silicide is titanium silicide.

3. The semiconductor device according to claim 1, wherein the second metal silicide is a material selected from the group consisting of WSi, ZrSi, HfSi, VSi, NbSi, TaSi, CrSi, MoSi, FeSi, CoSi, NiSi, RuSi, RhSi, PdSi, ReSi, OsSi, IrSi and PtSi.

* * * * *